(12) United States Patent
Ono

(10) Patent No.: US 6,740,807 B2
(45) Date of Patent: May 25, 2004

(54) LIGHT-RECEIVING DEVICE AND IMAGE SENSOR

(75) Inventor: Michio Ono, Kanagawa-ken (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/963,419

(22) Filed: Sep. 27, 2001

(65) Prior Publication Data

US 2003/0013008 A1 Jan. 16, 2003

(30) Foreign Application Priority Data

Sep. 27, 2000 (JP) ........................................ 2000-295255
Apr. 2, 2001 (JP) ........................................ 2001-103858

(51) Int. Cl.[7] .............................................. H01L 31/09
(52) U.S. Cl. ...................... 136/263; 136/255; 136/265; 257/431; 257/440; 257/443; 257/448; 250/208.1; 250/214 LS; 250/214 LA; 250/214.1
(58) Field of Search ................................ 136/250, 253, 136/255, 263, 265; 250/208.1, 214 LS, 214.1, 214 LA; 257/80, 82, 290, 291, 431, 440, 443, 448; 429/111

(56) References Cited

U.S. PATENT DOCUMENTS

| 2,963,276 A | | 10/1960 | Nelson | |
|---|---|---|---|---|
| 4,927,721 A | | 5/1990 | Gratzel et al. | |
| 4,985,618 A | * | 1/1991 | Inada et al. ............... | 250/208.1 |
| 5,107,104 A | * | 4/1992 | Miyasaka .................... | 257/40 |
| 5,120,325 A | * | 6/1992 | Dow, Jr. .................... | 604/304 |
| 5,260,559 A | * | 11/1993 | Miyasaka ................ | 250/208.1 |
| 5,350,644 A | | 9/1994 | Graetzel et al. | |
| 6,087,651 A | * | 7/2000 | Koyama ................... | 205/214.1 |
| 6,300,559 B1 | * | 10/2001 | Ohmori ....................... | 136/263 |
| 6,300,612 B1 | * | 10/2001 | Yu .......................... | 250/208.1 |
| 6,310,282 B1 | * | 10/2001 | Sakurai et al. ............... | 136/263 |

FOREIGN PATENT DOCUMENTS

| JP | 03205520 A | * | 9/1991 | ............. G01J/1/00 |
|---|---|---|---|---|
| JP | 11-37838 A | | 2/1999 | |
| JP | 2001-217451 A | | 8/2001 | |
| WO | WO 9909603 A1 | * | 2/1999 | ........... H01L/51/00 |

OTHER PUBLICATIONS

Merriam–Webster's Collegiate Dictionary 10th "chromoprotein" (1999) Pp. 204.*
"A low cost, high–efficiency solar cell based on dye–sensitized colloidal $TiO_2$ films", O'Regan et al, Nature vol. 353, pp. 737–740, Oct. 24, 1991.

* cited by examiner

Primary Examiner—Nam Nguyen
Assistant Examiner—Brian L. Mutschler
(74) Attorney, Agent, or Firm—Sughrue Mion, PLLC

(57) ABSTRACT

A differential response light-receiving device comprising: a semiconductor electrode comprising an electrically conductive layer and a photosensitive layer containing a semiconductor sensitized by a dye; an ion-conductive electrolyte layer; and a counter electrode, the differential response light-receiving device making time-differential response to quantity of light to output a photoelectric current. A composite light-receiving device comprising the differential response light-receiving device and a stationary response light-receiving device, and an image sensor using the differential response light-receiving device or the composite light-receiving device are also provided.

14 Claims, 14 Drawing Sheets

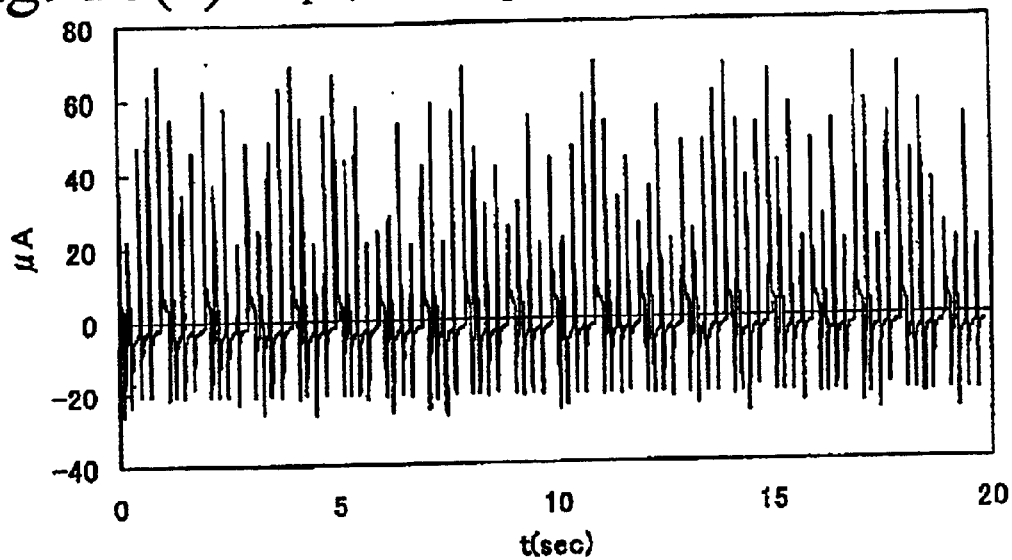
Fig. 18(a) 60 rpm, 20 Turns per 20 Seconds
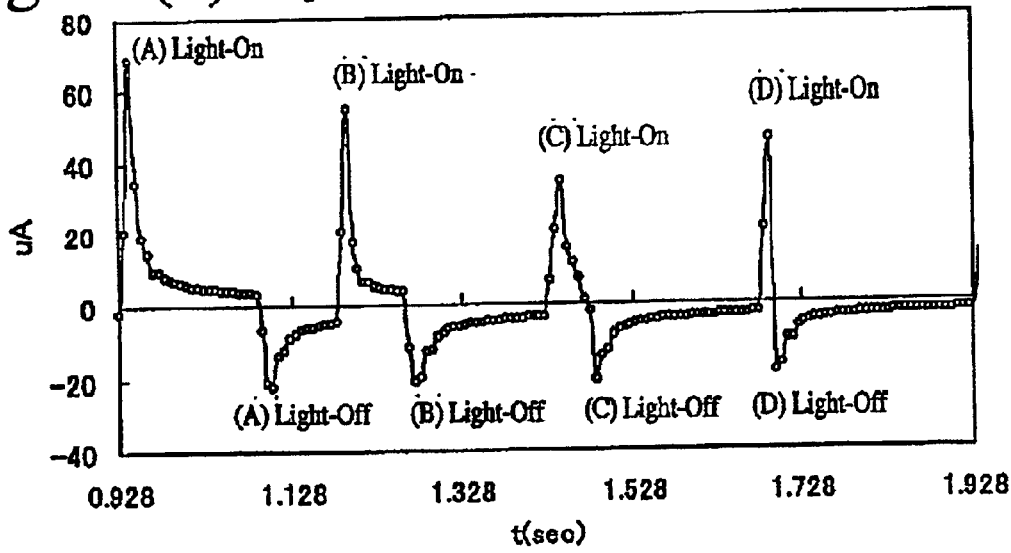
Fig. 18(b) Response to Light in one Turn Fig. 20(a)
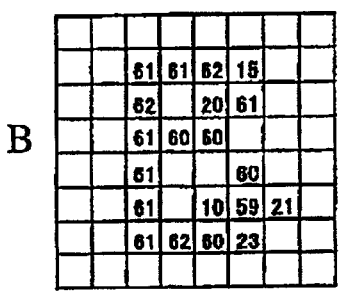
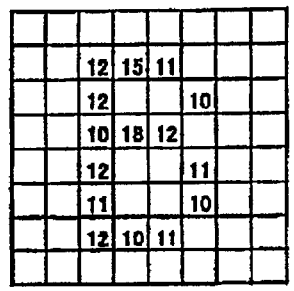
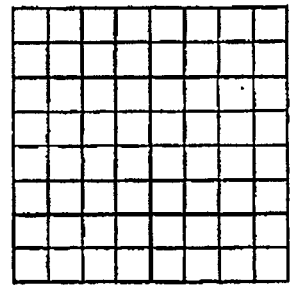
Blue-Sensitive Semiconductor Electrode | Green-Sensitive Semiconductor Electrode | Red-Sensitive Semiconductor Electrode
Fig. 20(b)
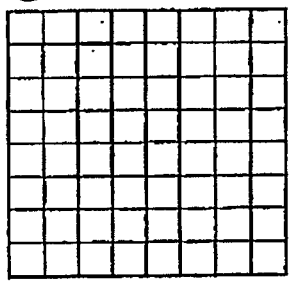
Fig. 20(c)
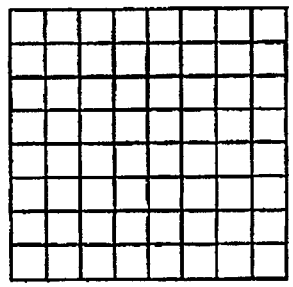

Light-Receiving Surface
(6.5 cm from Center)

LIGHT-RECEIVING DEVICE AND IMAGE SENSOR

BACKGROUND OF THE INVENTION

The present invention relates to a differential response light-receiving device comprising a semiconductor sensitized by a dye, and particularly to such a differential response light-receiving device that makes selective, immediate response to a moving content in an image. Further, the present invention relates to a composite light-receiving device, which comprises the differential response light-receiving device and a stationary response light-receiving device making different response to a photoimage, to receive a static photo-information and a dynamic photo-information at a two-dimensionally same surface at the same time. Furthermore, the present invention also relates to an image sensor using the differential response light-receiving device or the composite light-receiving device.

Recently, remarkable progress has been made in technology for fine manufacturing art and in the photolithography so that image information-recording density has been improved more and more.

Conventionally, development of light-receiving devices (light-sensitive devices) comprising high-sensitive sensors, high-density recording devices, etc. substantially has depended on the fine manufacturing art using a silicon substrate, thus, functions of the light-receiving devices have been controlled by the silicon and components disposed thereon. Though the image information-recording density has been improved, the image information received by the light-receiving device is inevitably processed in circuit and software. Solid light-receiving devices composed of silicon hardly have various functions required for use in an image-processing system of the next generation, for example, a function for discriminating and processing an information like an animal sight with a pattern recognition and an extraction of motion. Consequently, to use the solid light-receiving devices in a visual information-processing system, a high-performance computer plays an extremely important role for processing information outputted from the solid light-receiving device.

As a so-called, differential response light-receiving device that directly converts variations in optical input signals to an electrical signal, an electrochemical cell comprising a transparent electrode/a bacteriorhodopsin thin film/an electrolyte/counter electrode has been disclosed in Japanese Patent Laid-Open No. 3-205520, and an electrochemical cell comprising a transparent electrode/an electrolyte/a silicon substrate has been disclosed in Japanese Patent Laid-Open No. 11-37838. The former electrochemical cell is known as a first example of the differential response light-receiving device that makes time-differential response to quantity of light, however, the cell uses a protein to be poor in sensitivity and stability. Although the latter electrochemical cell is improved with respect to the sensitivity, the cell uses the silicon substrate to have disadvantages as follows: (i) the silicon substrate is formed by precisely processing Si wafer or by vapor depositing silicon, resulting in high costs; (ii) the silicon is sensitive to infrared light and heat rays so that the cell is decreased with respect to S/N ratio in the image detection under dark light sources in a room to need an infrared light cut filter. Further, both of the two electrochemical cells have a narrow range of choice with regard to spectral wavelength characteristics, thereby not being suitable for color sensors.

OBJECT AND SUMMARY OF THE INVENTION

An object of the present invention is to provide a differential response light-receiving device that overcomes the above problems of the prior art, and a differential response image sensor that uses the device to be capable of discriminating even color information. Further object of the present invention is to provide a composite light-receiving device capable of sensing color information, a static photo-information and a dynamic photo-information at the same time, and an image sensor using the composite light-receiving device.

A differential response light-receiving device of the present invention comprises: a semiconductor electrode comprising an electrically conductive layer and a photosensitive layer containing a semiconductor sensitized by a dye; an ion-conductive electrolyte layer; and a counter electrode, and makes time-differential response to quantity of light to output a photoelectric current. In the differential response light-receiving device of the present invention, the ion-conductive electrolyte layer is preferably free of redox species. The semiconductor is preferably a metal chalcogenide, more preferably a metal oxide selected from the group consisting of $TiO_2$, $ZnO$, $SnO_2$ and $WO_3$.

The differential response light-receiving device may comprise a plurality of semiconductor electrodes, photosensitive wavelengths of the semiconductor electrodes being different from each other, the ion-conductive electrolyte layer being disposed between the semiconductor electrodes and the counter electrode. In this case, the semiconductor electrodes are preferably arranged in such order that the photosensitive wavelengths are increasing from light incident side of the differential response light-receiving device, and the semiconductor electrodes may comprise a blue-sensitive semiconductor electrode, a green-sensitive semiconductor electrode and a red-sensitive semiconductor electrode arranged in this order from the light incident side.

A composite light-receiving device of the present invention comprises the differential response light-receiving device and a stationary response light-receiving device. The differential response light-receiving device and the stationary response light-receiving device are arranged horizontally to said light-receiving surface or the differential response light-receiving device is stacked on the stationary response light-receiving device in the direction of light incidence.

In the composite light-receiving device, the stationary response light-receiving device preferably comprises: a semiconductor electrode comprising an electrically conductive layer and a photosensitive layer containing a semiconductor sensitized by a dye; a charge transfer layer comprising a hole-transporting material or an electrolyte composition containing redox species; and a counter electrode. In the stationary response light-receiving device, the semiconductor is preferably a metal chalcogenide, more preferably a metal oxide selected from the group consisting of $TiO_2$, $ZnO$, $SnO_2$ and $WO_3$.

The stationary response light-receiving device may comprise a plurality of semiconductor electrodes, photosensitive wavelengths of the semiconductor electrodes being different from each other, the charge transfer layer being disposed between the semiconductor electrodes and the counter electrode. In this case, the semiconductor electrodes are preferably arranged in such order that the photosensitive wavelengths are increasing from light incident side of the composite light-receiving device, and the semiconductor electrodes may comprise a blue-sensitive semiconductor electrode, a green-sensitive semiconductor electrode and a red-sensitive semiconductor electrode arranged in this order from the light incident side.

An image sensor of the present invention comprises a plurality of pixels, each of the pixels comprising the differential response light-receiving device of the present invention or the composite light-receiving device of the present invention.

BRIEF DESCRIPTION OF THE DRAWINGS

FIG. 18(a) is a graph showing the relation between quantity of light and photoelectric current provided by the differential response light-receiving device P-101 produced in Example 1;

FIG. 18(b) is a graph showing the relation between quantity of light and photoelectric current provided by the differential response light-receiving device P-101 produced in Example 1;

FIGS. 20(a) to 20(c) are diagrams showing the maximum values of the photoelectric currents, which are provided in response to irradiation of blue-colored image of "B", green-colored image of "G" and red-colored image of "R" by pixels disposed in each of blue-photosensitive layer, green-photosensitive layer and red-photosensitive layer of the image sensor of the present invention produced in Example 2;

FIG. 21(a) is a schematic view showing a semiconductor electrode, FIG. 21(b) is a schematic view showing a counter electrode, FIG. 21(c) is a schematic view showing a cell provided by stacking the semiconductor electrode and the counter electrode, and FIG. 21(d) is a cross sectional view showing the cell;

DETAILED DESCRIPTION OF THE PREFERRED EMBODIMENTS

Figure 1:
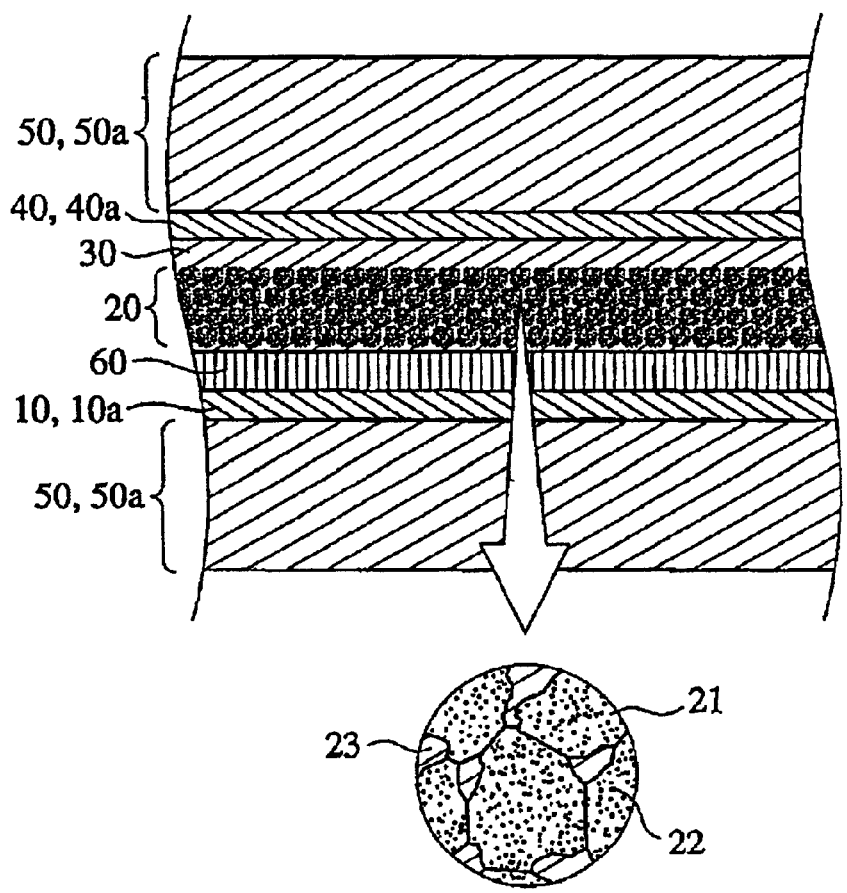
FIG. 1 is a partial cross sectional view showing an example of the differential response light-receiving device of the present invention.

A light-receiving device may have a structure similar to a photoelectric conversion device using an oxide semiconductor sensitized by a dye disclosed in Nature, Vol. 353, Page 737 to 740 (1991), U.S. Pat. No. 4,927,721, etc. Such a photoelectric conversion device is referred to as "dye-sensitized photoelectric conversion device." The dye-sensitized photoelectric conversion device generally comprises a semiconductor electrode composed of a conductive support and a photosensitive layer, a charge transfer layer and a counter electrode, and the photosensitive layer contains a semiconductor having a dye adsorbed thereon. The charge transfer layer contains redox species to transport electrons from the counter electrode to dye holes provided by optical pumping charge separation of the dye in the semiconductor electrode, whereby the dye-sensitized photoelectric conversion device outputs stationary photoelectric current. The light-receiving device having the structure similar to the dye-sensitized photoelectric conversion device makes stationary response to quantity of light to output a photoelectric current.

In contrast, a differential response light-receiving device of the present invention has an ion-conductive electrolyte layer instead of the charge transfer layer containing the redox species. It is preferable that the ion-conductive electrolyte layer is free of the redox species, whereby the ion-conductive electrolyte layer does not have a function of supplying electrons to dye holes and/or a function of receiving electrons from a counter electrode. In the differential response light-receiving device of the present invention, a light injected to a photosensitive layer excites a dye contained therein, electrons are injected from the excited dye to a semiconductor, and the electrons are transported to the counter electrode through an external circuit. As a result, a dye hole, which is generally a cation or a cation radical, is generated in the photosensitive layer, while the counter electrode becomes in a charge separation state polarized to negative. Anions and cations in the ion-conductive electrolyte layer are distributed in the semiconductor electrode side and the counter electrode side to stabilize the charge separation state, respectively, whereby an electric double layer is formed at each of the electrodes. Charging current is provided with light irradiation and discharge current is provided without light irradiation in the electric double layer, whereby the differential response light-receiving device of the present invention makes time-differential response to quantity of light. Namely, the differential response light-receiving device of the present invention is an electric double layer condenser using light as an electromotive force.

The differential response light-receiving device, a composite light-receiving device and an image sensor using the device according to the present invention will be described in detail below.

[1] Differential Response Light-receiving Device

As shown in FIG. 1, The differential response light-receiving device of the present invention preferably comprises: an electrically conductive layer 10; a photosensitive layer 20 containing semiconductor fine particles 21 sensitized by dyes 22 and an electrolyte material 23 penetrated into voids among the particles; an ion-conductive electrolyte layer 30; and a counter electrically conductive layer 40 laminated in this order. An undercoating layer 60 may be disposed between the electrically conductive layer 10 and the photosensitive layer 20. The electrolyte material 23 is generally the same as the material used for the ion-conductive electrolyte layer 30. On the electrically conductive layer 10 and/or the counter electrically conductive layer 40 may be disposed a substrate 50 to improve the strength of the light-receiving device. In the present invention, a layer composed of the electrically conductive layer and the substrate disposed thereon if necessary is referred to as "conductive support", and a layer composed of the counter electrically conductive layer and the substrate disposed thereon if necessary is referred to as "counter electrode." Further, a layer composed of the conductive support and the photosensitive layer is referred to as "semiconductor electrode" in the present invention. Incidentally, the electrically conductive layer 10, the counter electrically conductive layer 40 and the substrate 50 shown in FIG. 1 may be a transparent electrically conductive layer 10a, a transparent counter electrically conductive layer 40a and a transparent substrate 50a, respectively.

In the light-receiving device shown in FIG. 1, in the case of using an n-type semiconductor fine particle, a light injected to the photosensitive layer 20 excites the dye 22, etc., excited high energy electrons therein are transported to a conduction band of the semiconductor fine particles 21, and they are diffused to reach to the electrically conductive layer 10. At this time, the dye 22 is in oxidized form. In the differential response light-receiving device of the present invention, the electrons in the electrically conductive layer 10 reach to the counter electrically conductive layer 40 through the external circuit. The charge separation state of the semiconductor electrode and the counter electrode is stabilized by ion orientation in the ion-conductive electrolyte layer 30. In a boundary of each layer such as a boundary between the electrically conductive layer 10 and the photosensitive layer 20, a boundary between the photosensitive layer 20 and the ion-conductive electrolyte layer 30, a boundary between the ion-conductive electrolyte layer 30 and the counter electrically conductive layer 40, etc., components of each layer may be diffused and mixed.

(A) Semiconductor Electrode

The semiconductor electrode comprises the electrically conductive layer and the photosensitive layer containing a semiconductor sensitized by a dye. The semiconductor electrode may comprise the undercoating layer, etc. between the photosensitive layer and the conductive support.

(1) Conductive Support

The conductive support is composed of (1) a single layer of the electrically conductive layer, or (2) two layers of the electrically conductive layer and the substrate. In the case of (1), the electrically conductive layer is preferably made of a material that has a sufficient strength and that can sufficiently seal the light-receiving device, for example, a metal such as platinum, gold, silver, copper, zinc, titanium, aluminum and an alloy composed thereof. In the case of (2), the substrate on which the electrically conductive layer containing an electrically conductive material is disposed at the photosensitive layer side may be used as the conductive support. Preferable examples of the electrically conductive material include: metals such as platinum, gold, silver, copper, zinc, titanium, aluminum, indium and alloys composed thereof; carbon; electrically conductive metal oxides such as indium-tin composite oxides and tin oxides doped with fluorine or antimony; etc. The electrically conductive layer preferably has a thickness of 0.02 to 10 $\mu$m.

The surface resistance of the conductive support is desirable as low as possible. The surface resistance is preferably 50$\Omega$/square or less, more preferably 20$\Omega$/square or less.

When light is irradiated from the conductive support side, it is preferred that the conductive support is substantially transparent. Herein, the term "substantially transparent" means that the light transmittance is 10% or more to a light in visible region to near infrared region (400 to 1200 nm). The light transmittance is preferably 50% or more, more preferably 80% or more. The conductive support particularly preferably has high light transmittance to a light that the photosensitive layer has sensitivity to.

The transparent conductive support is preferably constituted by disposing the transparent electrically conductive layer of an electrically conductive metal oxide on the transparent substrate of such material as a glass and a plastic by means of coating or vapor deposition. The transparent electrically conductive layer is preferably made of tin dioxide doped with fluorine or antimony, or indium-tin oxide (ITO). The transparent substrate may be made of a glass such as low-cost soda glass excellent in strength and non-alkali glass that causes no alkaline elution. Additionally, a transparent polymer film is preferably used as the transparent substrate. Used as the materials for the transparent polymer film may be tetracetylcellulose (TAC), polyethylene terephthalate (PET), polyethylene naphthalate (PEN), syndiotactic polystyrene (SPS), polyphenylenesulfide (PPS), polycarbonate (PC), polyarylate (PAr), polysulfone (PSF), polyestersulfone (PES), polyimide (PI), polyetherimide (PEI), cyclic polyolefin, brominated phenoxy resin, etc. To secure a sufficient transparency, the coating amount of the electrically conductive metal oxide is preferably 0.01 to 100 g per 1 m$^2$ of the substrate.

It is preferable that a metal lead is used to reduce the resistance of the transparent conductive support. The metal lead is preferably made of a metal such as platinum, gold, nickel, titanium, aluminum, copper, silver, etc. It is preferable that the metal lead is provided on the transparent substrate by a vapor deposition method, a sputtering method, etc., the transparent electrically conductive layer of conductive tin oxide, ITO, etc. being disposed thereon. Reduction in incident light quantity owing to the metal lead is suppressed to preferably 10% or less, more preferably 1 to 5%.

(2) Photosensitive Layer

In the photosensitive layer, the semiconductor acts as a photosensitive substance to absorb a light and conduct charge separation, thereby generating electrons and positive holes. With respect to the dye-sensitized semiconductor, the light absorption and the generation of the electrons and the positive holes are primarily caused in the dye, and the semiconductor receives and conveys the electrons or the holes.

(a) Semiconductor

Used as the semiconductor may be: an elementary substance semiconductor such as silicon and germanium; a III–V series compound semiconductor; a metal chalcogenide such as a metal oxide, a metal sulfide, a metal selenide and a composite thereof; a compound having a perovskite structure such as strontium titanate, calcium titanate, sodium titanate, barium titanate and potassium niobate; etc. An n-type semiconductor is preferably used in the present invention, in which conductor electrons act as a carrier under photo-excitation condition to provide anode current.

Preferable examples of the metal chalcogenide include: oxide of titanium, tin, zinc, iron, tungsten, zirconium, hafnium, strontium, indium, cerium, yttrium, lanthanum, vanadium, niobium or tantalum; sulfide of cadmium, zinc, lead, silver, antimony or bismuth; selenide of cadmium or lead; cadmium telluride; etc. Additionally, the other compound semiconductors such as phosphides of zinc, gallium, indium or cadmium, selenides of gallium-arsenic or copper-indium, copper-indium sulfide, etc. may be used in this invention. Further, composite semiconductors such as $M_xO_yS_z$ and $M_{1x}M_{2y}O_z$ are also preferably used in the present invention, wherein M, $M_1$ and $M_2$ independently represent a metal atom, O represents an oxygen atom, S represents a sulfur atom, and x, y and z represent numbers combined with each other to form a neutral molecule.

Preferable specific examples of the semiconductor include Si, $TiO_2$, $SnO_2$, $Fe_2O_3$, $WO_3$, ZnO, $Nb_2O_5$, CdS, ZnS, PbS, $Bi_2S_3$, CdSe, CdTe, $SrTiO_3$, GaP, InP, GaAs, $CuInS_2$ and $CuInSe_2$. Of these semiconductors, more preferred are $TiO_2$, $SnO_2$, $Fe_2O_3$, $WO_3$, ZnO, $Nb_2O_5$, CdS, PbS, CdSe, $SrTiO_3$, InP, GaAs, $CuInS_2$ and $CuInSe_2$, particularly preferred are $TiO_2$, ZnO, $SnO_2$, $WO_3$, and $Nb_2O_5$, and the most preferred is $TiO_2$. $TiO_2$ used in the present invention may contain anatase-type crystal structure of preferably 70 volume % or more, particularly preferably 100 volume %. It is preferable that the semiconductor is doped with a metal to increase electron conductivity thereof. This metal is preferably divalent or trivalent. Further, the semiconductor is preferably doped with a monovalent metal to prevent a reverse current from being provided from the semiconductor to the ion-conductive electrolyte layer.

The semiconductor may have a single crystal or poly crystal structure. The poly crystal semiconductor is preferred from the viewpoints of the production cost, the security of the raw materials, the energy-payback time, etc. The photosensitive layer is particularly preferably a porous semiconductor fine particle layer. The photosensitive layer may partly contain an amorphous semiconductor.

The particle size of the semiconductor fine particle is generally in the nm to μm level. The mean size of primary semiconductor particles, which is obtained from a diameter of a circle equivalent to a projected area thereof, is preferably 5 to 200 nm, more preferably 8 to 100 nm. Further, the mean size of secondary semiconductor particles in dispersion is preferably 0.01 to 30 μm.

Two or more of the semiconductor fine particles having a different particle size distribution may be mixed to use for the photosensitive layer. In this case, the average particle size of the smaller particles is preferably 25 nm or less, more preferably 10 nm or less. To improve a light-capturing rate of the light-receiving device by scattering ray of incident light, the semiconductor fine particles having a large particle size, e.g. approximately 100 to 300 nm in diameter, may be used for the photosensitive layer.

Two or more kinds of the semiconductor fine particles may be used for the photosensitive layer. In this case, it is preferable that one is $TiO_2$, ZnO, $Nb_2O_5$ or $SrTiO_3$ and the other is $SnO_2$, $Fe_2O_3$ or $WO_3$. More preferred combination is ZnO and $SnO_2$, ZnO and $WO_3$, ZnO, $SnO_2$ and $WO_3$, etc. Each of the semiconductor fine particles may have a different diameter. Particularly preferred is a combination of $TiO_2$, ZnO, $Nb_2O_5$ or $SrTiO_3$ having a larger diameter and $SnO_2$, $Fe_2O_3$ or $WO_3$ having a smaller diameter. The larger diameter is preferably 100 nm or more, and the smaller diameter is preferably 15 nm or less.

Preferred as a method for producing the semiconductor fine particles are: sol-gel methods described in Sumio Sakka, "Zoru-Geru-Ho No Kagaku (Science of Sol-Gel Method)", Agune Shofusha (1998), Technical information Association, "Zoru-Geru-Ho Niyoru Hakumaku Coating Gijutu (Thin Film-Coating Technology by Sol-Gel Method)" (1995), etc.; and gel-sol methods described in Tadao Sugimoto, "Shin-Goseiho Geru-Zoru-Ho Niyoru Tanbunsanryusi No Gosei To Saizu-Keitaiseigyo (Synthesis of Mono-Dispersion Particles and Control of Their Size and Form by Novel Gel-Sol Method)", and MATERIA, Vol. 35, No. 9, Page 1012 to 1018 (1996). The method developed by Degussa Company, which comprises preparing oxides by subjecting chlorides to a high temperature hydrolysis in an oxyhydrogen salt, is also preferred.

In the case of using titanium oxide as the semiconductor fine particles, any of the above-described sol-gel methods, gel-sol methods and high temperature hydrolysis method are preferably used, further, a sulfuric acid method and a chlorine method described in Manabu Seino, "Sanka-Chitan Bussei To Ouyougijutu (Titanium oxide—Properties and Applied Technique)", Gihodo Shuppan, (1997) may be used. Of the sol-gel methods, also preferred are such that described in Christophe J. Barb'e, et al, Journal of American Ceramic Society, Vol. 80, No. 12, Page 3157 to 3171 (1997) and Burnside, et al, Chemistry of Materials, Vol. 10, No. 9, Page 2419 to 2425.

(b) Semiconductor Fine Particle Layer

The semiconductor fine particles may be applied onto the conductive support by: a method where the conductive support is coated with a dispersion or a colloidal solution containing the particles; the above-mentioned sol-gel method; etc. A wet type film production method is relatively advantageous for the mass production of the light-receiving device, improvement of properties of the semiconductor fine particle solution, and improvement of the adaptability of the conductive support, etc. As such a wet type film production method, coating methods, printing methods, electrolytic deposition methods and electrodeposition techniques are typical examples. Further, the semiconductor fine particle layer may be disposed by: oxidizing a metal; an LPD method where a metal solution is subjected to ligand exchange, etc.;

a sputtering method; a vapor deposition method; a CVD method; or an SPD method where a thermal decomposition-type metal oxide precursor is sprayed on a heated substrate to generate a metal oxide.

The dispersion containing the semiconductor fine particles may be prepared by: the sol-gel methods mentioned above; crushing the semiconductor in a mortar; dispersing the semiconductor while grinding it in a mill; synthesizing and precipitating the semiconductor fine particles in a solvent; etc.

As a dispersion solvent, water or organic solvents such as methanol, ethanol, isopropyl alcohol, citronellol, terpineol, dichloromethane, acetone, acetonitrile, ethyl acetate, etc. may be used. A polymer such as polyethylene glycol, hydroxyethylcellulose and carboxymethylcellulose, a surfactant, an acid, a chelating agent, etc. may be used as a dispersing agent, if necessary. In particular, it is preferable that polyethylene glycol is added to the dispersion because the viscosity of the dispersion and the porosity of the semiconductor fine particle layer can be controlled by changing the molecular weight of the polyethylene glycol, and the semiconductor fine particle layer containing polyethylene glycol is hardly peeled off.

Preferred coating methods include: a roller method and a dip method as an application series; an air-knife method and a blade method as a metering series; etc. Further, preferable as a method where an application and metering can be performed at the same time are a wire-bar method disclosed in JP-B-58-4589, a slide-hopper method described in U.S. Pat. Nos. 2,681,294, 2,761,419, 2,761,791, etc., an extrusion method, a curtain method, etc. Furthermore, as for a wide use, a spin method and a spray method are preferred. As a wet type printing method, three major printing methods of a relief printing, an offset printing and a gravure printing, an intaglio printing, a gum printing, a screen printing, etc. are preferred. A preferable film production method may be selected from these methods in accordance with the viscosity of the dispersion and the desired wet thickness.

The semiconductor fine particle layer is not limited to a single layer. The dispersions each comprising the semiconductor fine particles having a different particle size may be subjected to a multi-layer coating. Further, the dispersions each containing different kinds of semiconductor fine particles, binder or additives may be subjected to a multi-layer coating. The multi-layer coating is also effectively used when the thickness of the layer is insufficient by coating of once.

Generally, when the thickness of the semiconductor fine particle layer, equal to the thickness of the photosensitive layer, becomes thicker, the amount of the dye incorporated therein per unit of the projected area increases to make the light-capturing rate higher. However, because diffusion distances of the generated electrons are increased in this case, loss owing to recombination of the electric charges is also increased. Consequently, the preferable thickness of the semiconductor fine particle layer is 0.1 to 100 $\mu$m. A coating amount of the semiconductor fine particles per 1 $m^2$ of the conductive support is preferably 0.5 to 100 g, more preferably 3 to 50 g.

After applying the semiconductor fine particles onto the conductive support, the particles are preferably subjected to a heat treatment, to electronically contact them with each other and to increase the coating strength and the adherence thereof with the support. The heating temperature is preferably 40 to 700° C., more preferably 100 to 600° C. The heating time is preferably 10 minutes to 10 hours. It is not preferred that the substrate having low melting point or softening point such as a polymer film is subjected to a high temperature treatment because such a substrate tends to be deteriorated thereby. The heat treatment is preferably carried out at a temperature as low as possible, for example, 50 to 350° C., also from the viewpoint of cost. The semiconductor fine particle layer containing the smaller semiconductor fine particles having a size of 5 nm or less, a mineral acid, a metal oxide precursor, etc. can be heat-treated at such a low temperature. Further, the heat treatment may be carried out while applying ultraviolet ray, infrared ray, microwave, electric field, ultrasonic wave, etc. to the semiconductor fine particles, to reduce the heating temperature. To remove unnecessary organic compounds, etc., the heat treatment is preferably carried out in combination with evacuation, oxygen plasma treatment, washing by pure water, a solvent or a gas, etc.

After the heat treatment, the semiconductor fine particle layer may be subjected to a chemical metal-plating using an titanium tetrachloride aqueous solution, etc. or an electro-chemical metal-plating using an titanium trichloride aqueous solution, etc., to increase the surface area of the semiconductor fine particles, or to enhance a purity of the particles, thereby improving the electron-injecting efficiency into the particles from the dye. Further, to prevent a reverse current from being provided from the semiconductor fine particles to the ion-conductive electrolyte layer, on the semiconductor fine particles is preferably adsorbed an organic compound having low electron conductivity. The organic compound preferably has a hydrophobic group.

It is preferable that the semiconductor fine particle layer has a large surface area to adsorb lots of dyes. The surface area of the semiconductor fine particle layer is preferably 10 times or more, more preferably 100 times or more of its projected area. The highest limit, even though it is not limited in particular, is generally a level of 1000 times.

(c) Dye

The dye used for the photosensitive layer is not particularly limited if it can absorb a light in visible region, near infrared region, etc. and can sensitize the semiconductor fine particle. The dye is preferably selected from the group consisting of organic metal complex dyes, methine dyes, porphyrin dyes and phthalocyanine dyes, and particularly preferably an organic metal complex dye. To make the photoelectric conversion wave range of the light-receiving device larger, and to increase the photoelectric conversion efficiency, two or more kinds of the dyes are preferably used as a mixture or in combination thereof In the case of using two or more kinds of the dyes, the kinds and the ratio of the dyes may be selected in accordance with the wave range and the strength distribution of the light source.

The dye preferably has an interlocking group, which can interact or adsorb to the surface of the semiconductor fine particles. Preferred interlocking groups include acidic groups such as —COOH, —OH, —SO$_3$H, —P(O)(OH)$_2$ and —OP(O)(OH)$_2$, and π-conductive chelating groups such as an oxime group, a dioxime group, a hydroxyquinoline group, a salicylate group and an α-ketoenolate group. Among them, particularly preferred are —COOH, —P(O)(OH)$_2$ and —OP(O)(OH)2. The interlocking group may form a salt with an alkaline metal, etc. or an intramolecular salt. In the polymethine dye, an acidic group such as squarylium ring group or croconium ring group formed by the methine chain may act as the interlocking group.

The preferred dyes used for the photosensitive layer will be specifically described below.

(I) Organic Metal Complex Dye

The metal complex dye used in the present invention is preferably a metallophthalocyanine dye, a metal porphyrin dye or a ruthenium complex dye, particularly preferably a ruthenium complex dye. The ruthenium complex dyes described in U.S. Pat. Nos. 4,927,721, 4,684,537, 5,084,365, 5,350,644, 5,463,057 and 5,525,440, Japanese Patent Laid-Open Nos. 7-249790 and 2000-26487, Japanese Patent Publication No. 10-504512, WO 98/50393, etc. may be used in the present invention.

The ruthenium complex dye used in the present invention is preferably represented by the following general formula (I):

In the general formula (I), $A_1$ represents a monovalent or divalent ligand. $A_1$ is preferably selected from the group consisting of Cl, SCN, $H_2O$, Br, I, CN, NCO, SeCN, β-diketone derivatives, oxalic acid derivatives and dithiocarbamic acid derivatives. p is an integer of 0 to 3. B-a, B-b, and B-c independently represent an organic ligand represented by any of the following formulae B-1 to B-10.

B-1
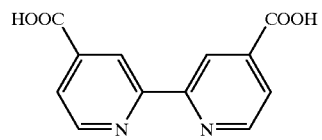

B-2
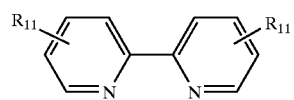

B-3
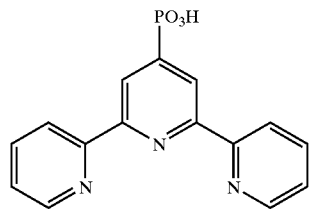

B-4
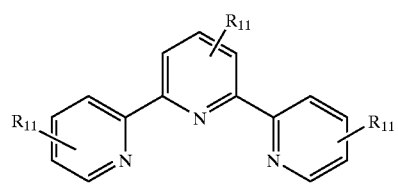

B-5
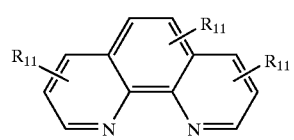

B-6
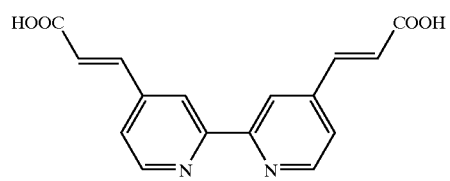

B-7
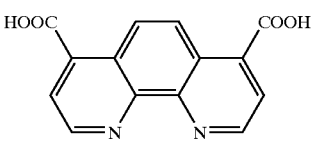

B-8
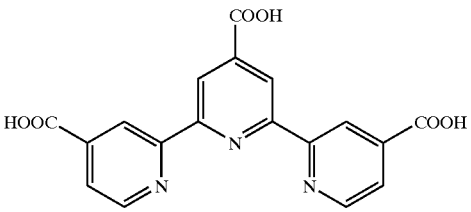

B-9
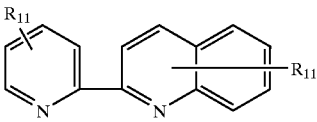

B-10
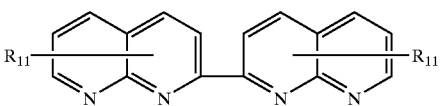

In the formulae B-1 to B-10, $R_{11}$ represents a hydrogen atom or a substituent. Specific examples of the substituent include: halogen atoms; substituted or unsubstituted alkyl groups having 1 to 12 carbon atom; substituted or unsubstituted aralkyl groups having 7 to 12 carbon atoms; substituted or unsubstituted aryl groups having 6 to 12 carbon atoms; acidic groups that may form a salt such as carboxyl group and phosphono group; chelating groups; etc. The alkyl group and the alkyl moiety of the aralkyl group may be straight or branched, and the aryl group and the aryl moiety of the aralkyl group may have a monocyclic structure or a polycyclic structure such as a condensed ring and a ring assemblage. B-a, B-b and B-c may be the same or different ligands, and the ruthenium complex dye represented by the general formula (I) may have only one or two of B-a, B-b and B-c.

The metal complex dyes preferably used in the present invention will be illustrated below without intention of restricting the scope of the present invention defined by the claims attached hereto.

|      | $A_1$ | p | B-a | B-b | B-c | $R_{11}$ |
|------|-----|---|-----|-----|-----|----------|
| R-1  | SCN | 2 | B-1 | B-1 | —   | —        |
| R-2  | CN  | 2 | B-1 | B-1 | —   | —        |
| R-3  | Cl  | 2 | B-1 | B-1 | —   | —        |
| R-4  | CN  | 2 | B-7 | B-7 | —   | —        |
| R-5  | SCN | 2 | B-7 | B-7 | —   | —        |
| R-6  | SCN | 2 | B-1 | B-2 | —   | H        |
| R-7  | SCN | 1 | B-1 | B-3 | —   | —        |
| R-8  | Cl  | 1 | B-1 | B-4 | —   | H        |
| R-9  | I   | 2 | B-1 | B-5 | —   | H        |
| R-10 | SCN | 3 | B-8 | —   | —   | —        |
| R-11 | CN  | 3 | B-8 | —   | —   | —        |
| R-12 | SCN | 1 | B-2 | B-8 | —   | H        |
| R-13 | —   | 0 | B-1 | B-1 | B-1 | —        |

-continued

| | $A_1$ | p | B-a | B-b | B-c | $R_{11}$ |
|---|---|---|---|---|---|---|

R-14

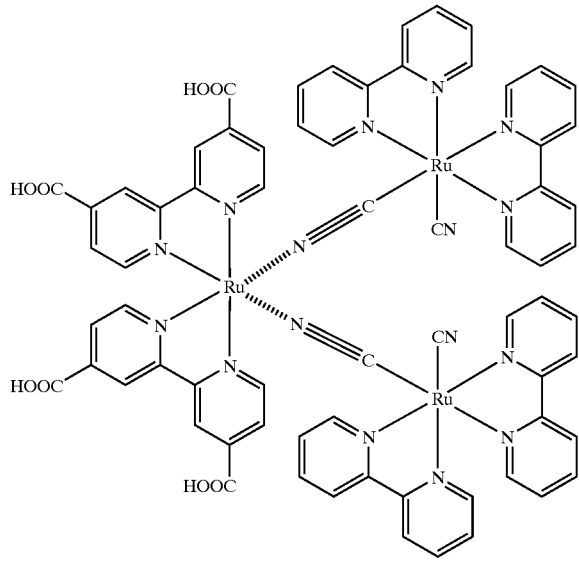

R-15

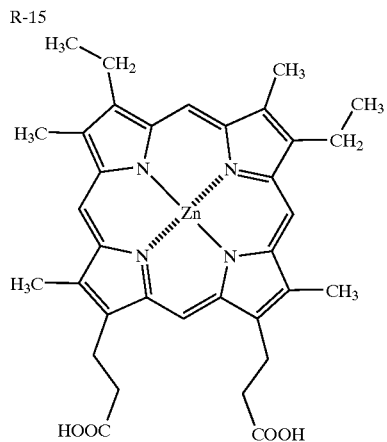

R-16

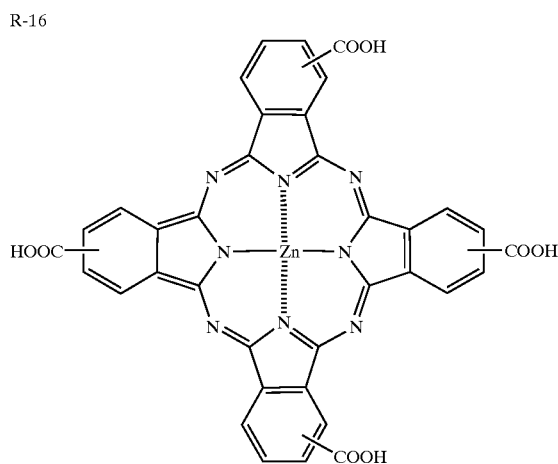

-continued

| | $A_1$ | p | B-a | B-b | B-c | $R_{11}$ |
|---|---|---|---|---|---|---|

R-17

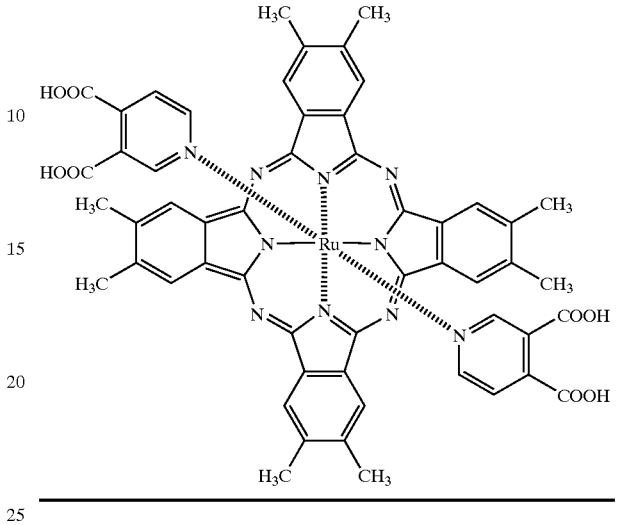

(II) Methine Dye

The methine dye used in the present invention is preferably a polymethine dye such as a cyanine dye, a merocyanine dye, a squalilium dye, etc. The polymethine dyes disclosed in Japanese Patent Laid-Open Nos. 11-35836, 11-67285, 11-86916, 11-97725, 11-158395, 11-163378, 11-214730, 11-214731, 11-238905 and 2000-26487, and European Patent Nos. 892411, 911841 and 991092 are preferably used in the present invention. Specific examples of the methine dye are shown below.

M-1

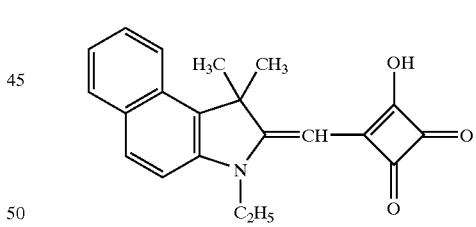

M-2

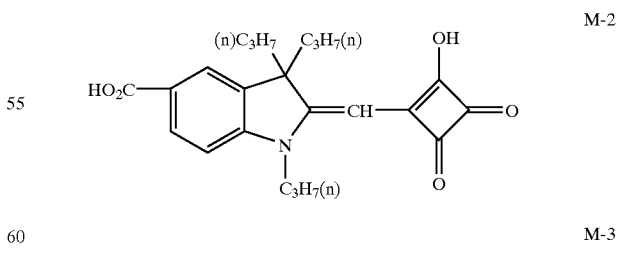

M-3

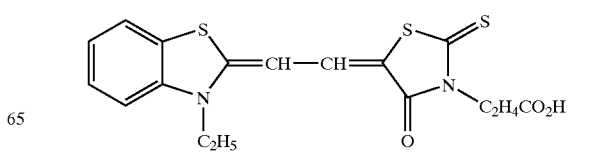

-continued

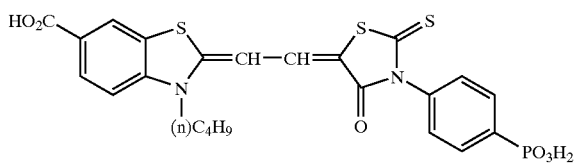
M-4

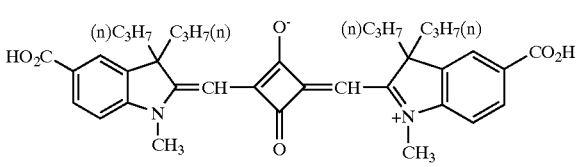
M-5

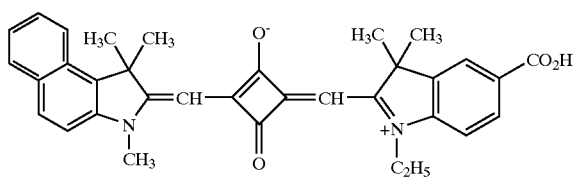
M-6

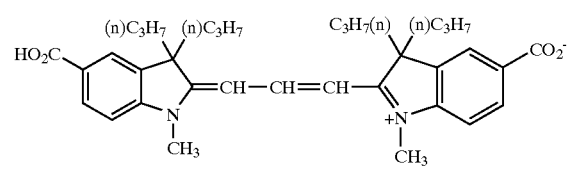
M-7

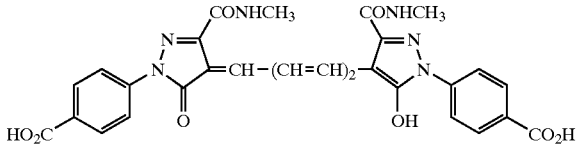
M-8

(d) Adsorption of Dye to Semiconductor Fine Particle

The dye may be adsorbed to the semiconductor fine particles by soaking the conductive support having the well-dried semiconductor fine particle layer in a dye adsorption solution, or by applying the dye adsorption solution to the semiconductor fine particle layer. In the former case, a soaking method, a dipping method, a roller method, an air-knife method, etc. may be used. In the soaking method, the dye may be adsorbed at a room temperature, or under reflux while heating as described in Japanese Patent Laid-Open No. 7-249790. As an applying method of the latter case, a wire-bar method, a slide-hopper method, an extrusion method, a curtain method, a spin method, a spray method, etc. may be used.

Examples of preferred solvent used with the dye include: alcohol solvents such as methanol, ethanol, t-butanol and benzylalcohol; nitrile solvents such as acetonitrile, propionitrile and 3-methoxypropionitrile; nitromethane; halogenated hydrocarbons such as dichloromethane, dichloroethane, chloroform and chlorobenzene; ether solvents such as diethylether and tetrahydrofuran; dimethylsulfoxide; amide solvents such as N,N-dimethylformamide and N,N-dimethylacetamide; N-methylpyrrolidone; 1,3-dimethylimidazolidinone; 3-methyloxazolidinone; ester solvents such as ethyl acetate and butylacetate; carbonate solvents such as diethyl carbonate, ethylene carbonate and propylene carbonate; ketone solvents such as acetone, 2-butanone and cyclohexanone; hydrocarbon solvents such as hexane, petroleum ether, benzene and toluene; mixtures thereof; etc.

The total adsorption amount of the dye is preferably 0.01 to 100 mmol per the unit surface area (1 $m^2$) of the conductive support. The amount of the dye adsorbed on the semiconductor fine particles is preferably 0.01 to 1 mmol per 1 g of the semiconductor fine particles. Such an adsorption amount of the dye effects a sufficient sensitization to the semiconductors. Too small amount of the dye results in insufficient sensitization effect. On the other hand, if the amount of the dye is excessive, the dye unadsorbed on the semiconductor fine particles floats to reduce the sensitization effect. To increase the adsorption amount of the dye, it is preferable that the semiconductor fine particle layer is subjected to a heat treatment before the dye is adsorbed thereon. After the heat treatment, it is preferable that the dye is quickly adsorbed on the semiconductor fine particle layer having a temperature of 60 to 150° C. before the layer is cooled to the room temperature, to prevent water from absorbing onto the semiconductor fine particle layer.

To weaken an interaction between the dyes such as association, a colorless compound may be co-adsorbed onto the semiconductor fine particles together with the dye. The colorless compound preferably has surface activity, and examples thereof include steroid compounds having a carboxyl group such as chenodeoxycholic acid, and sulfonates shown below.

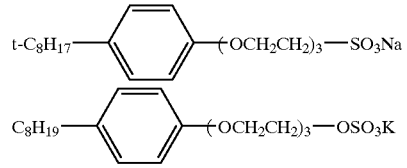

The dye unadsorbed on the semiconductor fine particle layer is preferably removed by washing immediately after the dye adsorption process. The washing is preferably carried out by a wet-type washing bath with a polar solvent such as acetonitrile or an organic solvent such as an alcohol solvent. The surface of the semiconductor fine particles may be treated with an amine compound or a quaternary salt after the dye adsorption process. The amine compound is preferably pyridine, 4-t-butylpyridine, polyvinylpyridine, etc., and the quaternary salt is preferably tetrabutylammonium iodide, tetrahexylammonium iodide, etc. The amine compound and the quaternary salt may be used singly when it is liquid, and may be used in a fashion of a solution in an organic solvent.

(3) Undercoating Layer

It is preferable that a fine semiconductor thin film is provided between the conductive support and the photosensitive layer as an undercoating layer to prevent short-circuit of the counter electrode and the conductive support, particularly in the case of using the ion-conductive electrolyte layer composed of the electron-transporting material or the hole-transporting material. The undercoating layer is preferably made of $TiO_2$, $SnO_2$, $Fe_2O_3$, $WO_3$, ZnO or $Nb_2O_5$, more preferably made of $TiO_2$. The undercoating layer may be disposed by a spray-pyrolysis method described in Electrochim. Acta, 40, 643 to 652 (1995), a sputtering method, etc. The thickness of the undercoating layer is preferably 5 to 1000 nm, more preferably 10 to 500 nm.

(B) Ion-conductive Electrolyte Layer

Electrolyte material used for the ion-conductive electrolyte layer is not particularly limited if it has ion-conductivity. Ions contained in the ion-conductive electrolyte layer are also not particularly limited. The electrolyte material preferably contains redox species, thus, it is preferable that the electrolyte material does not have electron conductivity and is not oxidized or reduced under a driving voltage of the differential response light-receiving device, usually 1 V or less. Examples of the electrolyte material used for the differential response light-receiving device include: molten salt electrolyte compositions; electrolysis solutions where ions are dissolved in a solvent; so-called gel electrolyte compositions where a electrolysis solution is penetrated into a polymer matrix; solid electrolyte compositions such as polymer electrolyte compositions and inorganic solid electrolyte; etc. As the inorganic solid electrolyte, conductive ion crystals, etc. may be used.

(1) Molten Salt Electrolyte Composition

The molten salt electrolyte composition comprises a molten salt electrolyte having a low melting point. In the present invention, pyridinium salts, imidazolium salts, triazolium salts, etc. disclosed in WO 95/18456, Japanese Patent Laid-Open No. 8-259543, "Denki Kagaku (Electrochemistry)", 65, 11, 923 (1997), etc. may be used as the molten salt electrolyte. The molten salt electrolyte preferably has the melting point of 100° C. or less, and it is particularly preferably in a liquid state at room temperature.

The molten salt electrolytes represented by any of the following general formulae (Y-a), (Y-b) and (Y-c) can be preferably used in the present invention.

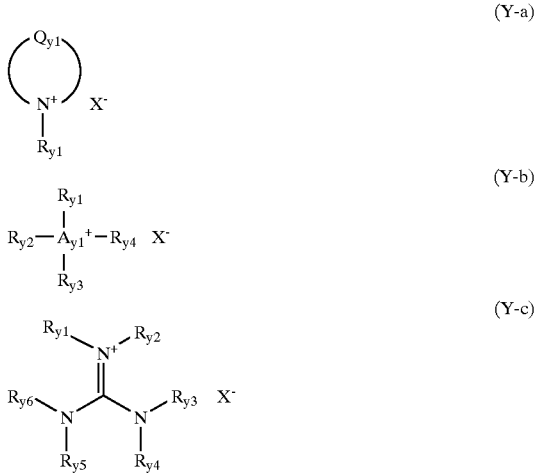

In the general formula (Y-a), $Q_{y1}$ represents an atomic group forming an aromatic cation having a 5- or 6-membered ring structure with the nitrogen atom. $Q_{y1}$ is preferably composed of atoms selected from the group consisting of carbon, hydrogen, nitrogen, oxygen and sulfur atoms. The 5-membered ring formed by $Q_{y1}$ is preferably oxazole ring, thiazole ring, imidazole ring, pyrazole ring, iso-oxazole ring, thiadiazole ring, oxadiazole ring, triazole ring, indole ring or pyrrole ring, more preferably oxazole ring, thiazole ring or imidazole ring, particularly preferably oxazole ring or imidazole ring. The 6-membered ring formed by $Q_{y1}$ is preferably pyridine ring, pyrimidine ring, pyridazine ring, pyrazine ring or triazine ring, more preferably pyridine ring.

In the general formula (Y-b), $A_{y1}$ represents a nitrogen atom or a phosphorus atom.

In the general formulae (Y-a), (Y-b) and (Y-c), $X^-$ represents an anion. $X^-$ is preferably a halide ion such as $I^-$, $Cl^-$ and $Br^-$, $SCN^-$, $BF_4^-$, $PF_6^-$, $ClO_4^-$, $N^-(SO_2CF_3)_2$, $N^-(SO_2CF_2CF_3)_2$, $CH_3SO_3^-$, $CF_3SO_3^-$, $CF_3COO^-$, $BPh_4^-$, $C^-(SO_2CF_3)_3$, etc., more preferably $SCN^-$, $BF_4^-$, $N^-(SO_2CF_3)_2$, $CF_3SO_3^-$ or $CF_3COO^-$.

$R_{y1}$ to $R_{y6}$ in the general formulae (Y-a), (Y-b) and (Y-c) independently represent: a substituted or unsubstituted alkyl group preferably having 1 to 24 carbon atom, which may be straight, branched or cyclic, such as methyl group, ethyl group, propyl group, isopropyl group, pentyl group, hexyl group, octyl group, 2-ethylhexyl group, t-octyl group, decyl group, dodecyl group, tetradecyl group, 2-hexyldecyl group, octadecyl group, cyclohexyl group, cyclopentyl group, etc.; or a substituted or unsubstituted alkenyl group preferably having 2 to 24 carbon atoms, which may be straight or branched, such as vinyl group, allyl group, etc. $R_{y1}$ to $R_{y6}$ is more preferably an alkyl group having 2 to 18 carbon atoms or an alkenyl group having 2 to 18 carbon atoms, particularly preferably an alkyl group having 2 to 6 carbon atoms, respectively.

Two or more of $R_{y1}$ to $R_{y4}$ in the general formula (Y-b) may be bonded together to form a non-aromatic ring containing $A_{y1}$. Two or more of $R_{y1}$ to $R_{y6}$ in the general formula (Y-c) may be bonded together to form a ring.

$Q_{y1}$ and $R_{y1}$ to $R_{y6}$ in the general formulae (Y-a), (Y-b) and (Y-c) may have a substituent, respectively. Preferable examples of the substituent include: halogen atoms such as F, Cl, Br and I; cyano group; alkoxy groups such as methoxy group, ethoxy group, methoxyethoxy group and methoxyethoxyethoxy group; aryloxy groups such as phenoxy group; alkylthio groups such as methylthio group and ethylthio group; alkoxycarbonyl groups such as ethoxycarbonyl group; carbonate groups such as ethoxycarbonyloxy group; acyl groups such as acetyl group, propionyl group and benzoyl group; sulfonyl groups such as methane sulfonyl group and benzene sulfonyl group; acyloxy groups such as acetoxy group and benzoyloxy group; sulfonyloxy groups such as methane sulfonyloxy group and toluene sulfonyloxy group; phosphonyl groups such as a diethylphosphonyl group; amido groups such as acetylamino group and benzoylamino group; carbamoyl groups such as N,N-dimethylcarbamoyl group; alkyl groups such as methyl group, ethyl group, propyl group, isopropyl group, cyclopropyl group, butyl group, 2-carboxyethyl group and benzyl group; aryl groups such as phenyl group and toluyl group; heterocyclic groups such as pyridyl group, imidazolyl group and furanyl group; alkenyl groups such as vinyl group and 1-propenyl group; silyl groups; silyloxy groups; etc.

The molten salt electrolytes represented by the general formula (Y-a), (Y-b) or (Y-c) may form an oligomer or a polymer through $Q_{y1}$ or $R_{y1}$ to $R_{y6}$.

The molten salt electrolyte represented by the general formula (Y-a), (Y-b) or (Y-c) may be used singly, and a plurality thereof may be used in combination with each other. Also, the molten salt electrolyte may be used in combination with an alkali metal salt such as LiI, $CF_3COOLi$, $CF_3COONa$, LiSCN and NaSCN. Weight ratio of the alkali metal salt is preferably 0.02 to 2 weight %, more preferably 0.1 to 1 weight %, to 100 weight % of the molten salt electrolyte composition.

The molten salt electrolytes preferably used in the present invention will be illustrated below without intention of restricting the scope of the present invention defined by the claims attached hereto.

| | |
|---|---|
| (Y1) Pyridinium with C₈H₁₇(n), X⁻ | Y1-1 X = BF₄<br>Y1-2 X = N(SO₂CF₃)₂<br>Y1-3 X = PF₆ |
| (Y2) 3-methylpyridinium with C₄H₉(n), X⁻ | Y2-1 X = BF₄<br>Y2-2 X = N(SO₂CF₃)₂<br>Y2-3 X = CF₃COO<br>Y2-4 X = SCN<br>Y2-5 X = CF₃SO₃ |
| (Y3) 3-methylpyridinium with CH₂CH, X⁻ | Y3-1 X = BF₄<br>Y3-2 X = N(SO₂CF₃)₂ |
| (Y4) 3-(CH₂CN)pyridinium with C₄H₉(n), X⁻ | Y4-1 X = BF₄<br>Y4-2 X = N(SO₂CF₃)₂ |
| (Y5) 3-(COOC₂H₅)pyridinium with C₄H₉(n), X⁻ | Y5-1 X = BF₄<br>Y5-2 X = N(SO₂CF₃)₂ |
| (Y6) H₃C—N⌐⌐N⁺—C₂H₅ imidazolium, X⁻ | Y6-1 X = BF₄<br>Y6-2 X = N(SO₂CF₃)₂<br>Y6-3 X = CF₃COO<br>Y6-4 X = SCN<br>Y6-5 X = CF₃SO₃ |
| (Y7) Me₃Si—CH₂—N⌐⌐N⁺—(CH₂CH₂O)₂CH₃, X⁻ | Y7-1 X = BF₄<br>Y7-2 X = N(SO₂CF₃)₂<br>Y7-3 X = CF₃COO<br>Y7-4 X = SCN |
| (Y8) (t)Bu—CH₂—N⌐⌐N⁺—(CH₂CH₂O)₂C₂H₅, X⁻ | Y8-1 X = BF₄<br>Y8-2 X = N(SO₂CF₃)₂<br>Y8-3 X = PF₆<br>Y8-4 X = CF₃COO<br>Y8-5 X = SCN<br>Y8-6 X = CF₃SO₃ |
| (Y9) 1,3-bis[(CH₂CH₂O)₂C₂H₅]imidazolium, X⁻ | Y9-1 X = BF₄<br>Y9-2 X = N(SO₂CF₃)₂<br>Y9-3 X = CF₃COO<br>Y9-4 X = SCN<br>Y9-5 X = CF₃SO₃ |
| (Y10) 1,3-bis[(CH₂CH₂O)₂CH₃]-2-(CH₂OCH₂CH₂OCH₃)imidazolium, X⁻ | Y10-1 X = BF₄<br>Y10-2 X = N(SO₂CF₃)₂ |

-continued
(Y11) 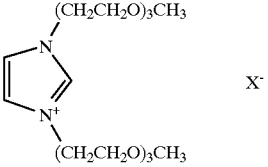
Y11-1 X = BF$_4$
Y11-2 X = N(SO$_2$CF$_3$)$_2$
(Y12) 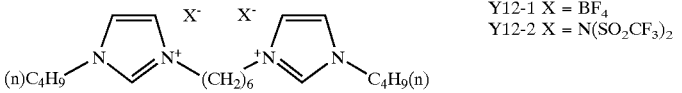
Y12-1 X = BF$_4$
Y12-2 X = N(SO$_2$CF$_3$)$_2$
(Y13) 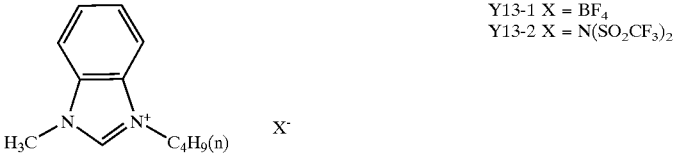
Y13-1 X = BF$_4$
Y13-2 X = N(SO$_2$CF$_3$)$_2$
(Y14) 
Y14-1 X = BF$_4$
Y14-2 X = N(SO$_2$CF$_3$)$_2$
(Y15) 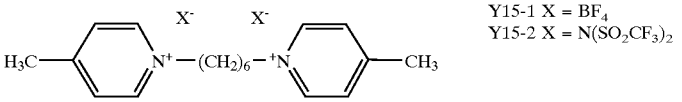
Y15-1 X = BF$_4$
Y15-2 X = N(SO$_2$CF$_3$)$_2$
(Y16) 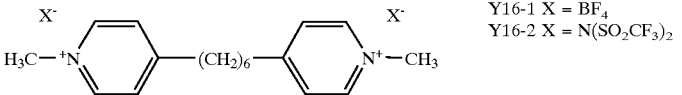
Y16-1 X = BF$_4$
Y16-2 X = N(SO$_2$CF$_3$)$_2$
(Y17) 
Y17-1 X = BF$_4$
Y17-2 X = N(SO$_2$CF$_3$)$_2$
Y17-3 X = PF$_6$
(Y18) 
Y18-1 X = BF$_4$
Y18-2 X = N(SO$_2$CF$_3$)$_2$
(Y19) 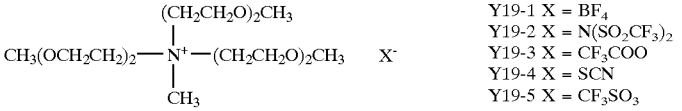
Y19-1 X = BF$_4$
Y19-2 X = N(SO$_2$CF$_3$)$_2$
Y19-3 X = CF$_3$COO
Y19-4 X = SCN
Y19-5 X = CF$_3$SO$_3$
(Y20) 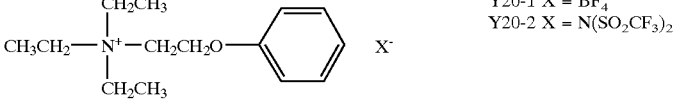
Y20-1 X = BF$_4$
Y20-2 X = N(SO$_2$CF$_3$)$_2$
(Y21) 
Y21-1 X = BF$_4$
Y21-2 X = N(SO$_2$CF$_3$)$_2$ -continued

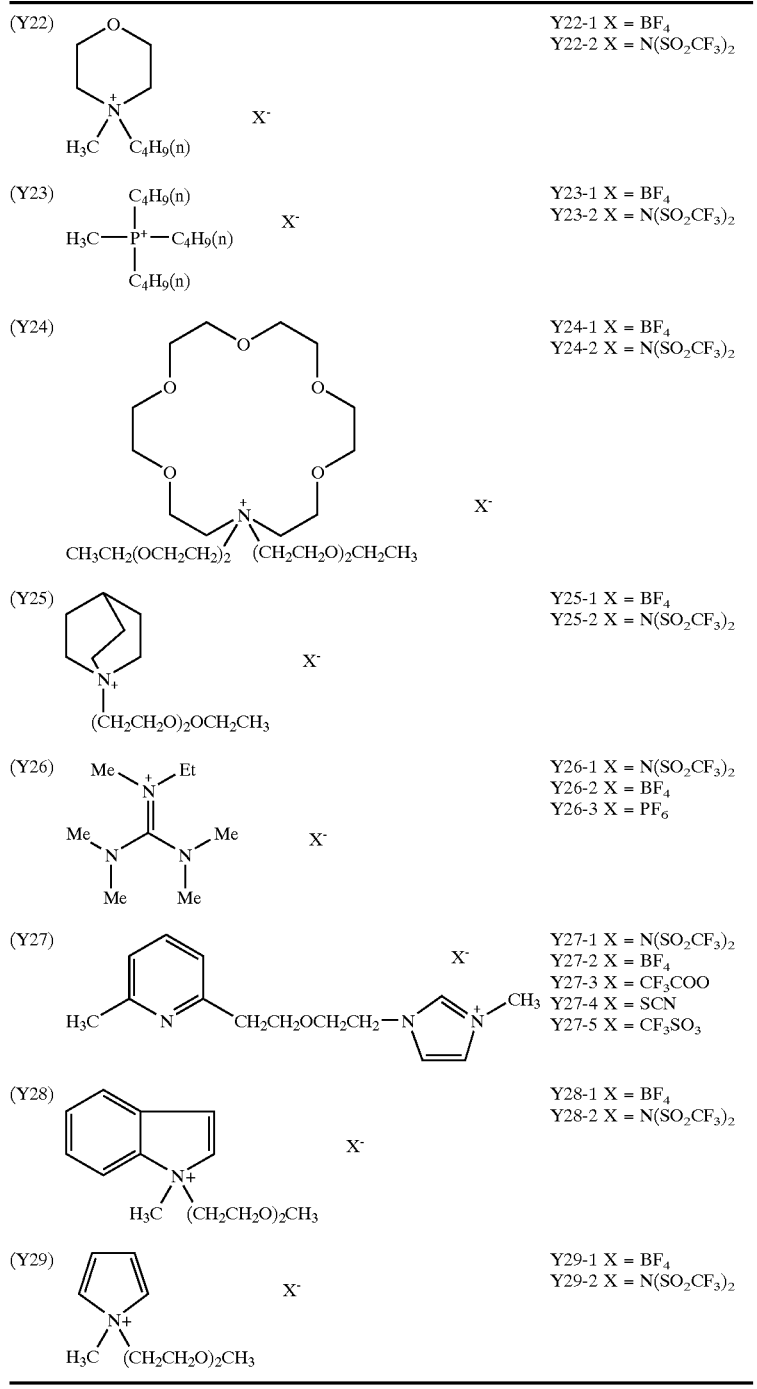

| | |
|---|---|
| (Y22) | Y22-1 X = BF$_4$ <br> Y22-2 X = N(SO$_2$CF$_3$)$_2$ |
| (Y23) | Y23-1 X = BF$_4$ <br> Y23-2 X = N(SO$_2$CF$_3$)$_2$ |
| (Y24) | Y24-1 X = BF$_4$ <br> Y24-2 X = N(SO$_2$CF$_3$)$_2$ |
| (Y25) | Y25-1 X = BF$_4$ <br> Y25-2 X = N(SO$_2$CF$_3$)$_2$ |
| (Y26) | Y26-1 X = N(SO$_2$CF$_3$)$_2$ <br> Y26-2 X = BF$_4$ <br> Y26-3 X = PF$_6$ |
| (Y27) | Y27-1 X = N(SO$_2$CF$_3$)$_2$ <br> Y27-2 X = BF$_4$ <br> Y27-3 X = CF$_3$COO <br> Y27-4 X = SCN <br> Y27-5 X = CF$_3$SO$_3$ |
| (Y28) | Y28-1 X = BF$_4$ <br> Y28-2 X = N(SO$_2$CF$_3$)$_2$ |
| (Y29) | Y29-1 X = BF$_4$ <br> Y29-2 X = N(SO$_2$CF$_3$)$_2$ |

Though the molten salt electrolyte composition may comprise a solvent, it particularly preferably comprises no solvent. The content of the molten salt electrolyte is preferably 50 weight % or more, particularly preferably 90 weight % or more, based on the entire composition.

(2) Electrolysis Solution

The electrolysis solution used in the present invention is preferably composed of an electrolyte, a solvent and an additive. The electrolyte is not particularly limited if only it can be dissolved in the solvent and ionized, and specific examples thereof include electrolyte salts comprising: a cation such as organic cations shown in above "(1) Molten Salt Electrolyte Composition" and metal cations (Li$^+$, K$^+$, Na$^+$, Ce$^{2+}$, etc.); and an anion such as above-mentioned X$^-$.

The solvent used for the electrolysis solution is preferably such that has a low viscosity and a high ionic mobility, or that has a high permittivity and can increase the actual carrier concentration of the electrolysis solution, to exhibit an excellent ionic conductibility. Examples of the solvent include: carbonates such as ethylene carbonate and propylene carbonate; heterocyclic compounds such as 3-methyl-2-oxazolidinone; ethers such as dioxan and diethyl ether;

chain ethers such as ethyleneglycol dialkylethers, propyleneglycol dialkylethers, polyethyleneglycol dialkylethers and polypropyleneglycol dialkylethers; alcohols such as methanol, ethanol, ethyleneglycol monoalkylethers, propyleneglycol monoalkylethers, polyethyleneglycol monoalkylethers and polypropyleneglycol monoalkylethers; glycols such as ethylene glycol, propylene glycol, polyethylene glycol, polypropylene glycol and glycerin; nitrile compounds such as acetonitrile, glutarodinitrile, methoxyacetonitrile, propionitrile and benzonitrile; aprotic polar solvents such as dimethylsulfoxide (DMSO) and sulfolane; water; etc. These solvents may be used in combination with each other.

(3) Gel Electrolyte Composition

The molten salt electrolyte composition, the electrolysis solution, etc. mentioned above may be gelled or solidified to prepare the gel electrolyte composition. Gelation may be achieved by: adding a polymer; adding an oil-gelling agent; polymerization of monomers including a multifunctional monomer; a cross-linking reaction of a polymer; etc. In the case where the gel electrolyte composition is prepared by adding a polymer, compounds described in "Polymer Electrolyte Reviews 1 and 2", edited by J. R. MacCallum and C. A. Vincent, ELSEIVER APPLIED SCIENCE may be used as the polymer. Of the compounds, polyacrylonitrile and poly(vinylidene fluoride) are preferred. In the case where the gel electrolyte composition is prepared by adding an oil-gelling agent, compounds described in J. Chem. Soc. Japan, Ind. Chem. Soc., 46, 779 (1943), J. Am. Chem. Soc., 111, 5542 (1989), J. Chem. Soc., Chem. Commun., 390 (1993), Angew. Chem. Int. Ed. Engl., 35, 1949 (1996), Chem. Lett., 885 (1996), J. Chem. Soc., Chem. Commun., 545 (1997), etc. may be used as the oil-gelling agent. Of the compounds, preferred are those having an amide structure. A method for gelling an electrolysis solution disclosed in Japanese Patent Laid-Open No. 11-185863 and a method for gelling a molten salt electrolyte composition disclosed in Japanese Patent Laid-Open No. 2000-58140 may be used in this invention.

In the case where the gel electrolyte composition is prepared by a cross-linking reaction of a polymer, it is preferable that a polymer containing a group having cross-linking reactivity is used in combination with a cross-linking agent. The group having the cross-linking reactivity is preferably amino group or a nitrogen-containing heterocyclic group such as pyridyl group, imidazolyl group, thiazolyl group, oxazolyl group, triazolyl group, morpholyl group, piperidyl group, piperazyl group, etc. The cross-linking agent is preferably an electrophilic agent having a plurality of functional group that can be attacked by the nitrogen atom, for example, multi-functional alkyl halides, aralkyl halides, sulfonates, acid anhydrides, acyl chlorides, isocyanates, $\alpha,\beta$-unsaturated sulfonyl compounds, $\alpha,\beta$-unsaturated carbonyl compounds, $\alpha,\beta$-unsaturated nitrile compounds, etc. Cross-linking methods disclosed in Japanese Patent Laid-Open Nos. 2000-17076 and 2000-86724 may be used in the present invention.

(4) Polymer Solid Electrolyte Composition

A polymer used for the polymer electrolyte composition may be any of: (i) a polymer that can dissolve an electrolyte salt to provide ionic conductivity; or (ii) a polymer that cannot dissolve an electrolyte salt, used with a solvent for dissolving the electrolyte salt.

Examples of the polymer of (i) include: poly(ethylene glycol); polymers composed of a main-chain having such a structure as poly(acrylic acid), poly(methacrylic acid), poly (ethylene oxide), poly(propylene oxide), poly(vinyl alcohol), polyphosphazene, polysilane and a copolymer thereof, and a side-chain having a structure of polyoxyethylene; etc. The polymer of (i) may be used with a solvent.

Examples of the polymer of (ii) include poly(vinyl chloride), polyacrylonitrile, polyethylene, polypropylene, polyesters, polyacrylate, copolymers thereof, etc. The polymer of (ii) may have a cross-linking structure.

(5) Additive

To the above-mentioned molten salt electrolyte composition, the electrolysis solution, etc. is preferably added a basic compound such as t-butylpyridine, 2-picoline, 2,6-lutidine, etc., as described in J. Am. Ceram. Soc., 80 (12), 3157 to 3171 (1997). The concentration of the basic compound therein is preferably 0.05 to 2 M.

(6) Method for Forming Ion-conductive Electrolyte Layer

The ion-conductive electrolyte layer may be provided by any of the following two methods. One is a method where the counter electrode is stuck on the photosensitive layer beforehand and the material for the ion-conductive electrolyte layer in the liquid state is made to penetrate a gap therebetween. Another is a method where the ion-conductive electrolyte layer is directly disposed on the photosensitive layer, the counter electrode being then disposed thereon.

In the former method, the material for the ion-conductive electrolyte layer may be made to penetrate the gap by a normal pressure process utilizing capillarity, or by a reduced pressure process where the material is pumped up from the gap to replace gas phase therein with liquid phase.

In the case of providing a wet ion-conductive electrolyte layer by the latter method, the wet ion-conductive electrolyte layer is applied to the photosensitive layer, the counter electrode is disposed on the wet ion-conductive electrolyte layer without drying it, and edges thereof is subjected to a treatment for preventing liquid-leakage, if necessary. In the case of providing a gel ion-conductive electrolyte layer by the latter method, the ion-conductive electrolyte material may be applied in the liquid state and gelled by polymerization, etc. In this case, the counter electrode may be disposed on the ion-conductive electrolyte layer before or after drying and fixing the ion-conductive electrolyte layer.

In the case of using the solid electrolyte composition, the ion-conductive electrolyte layer may be formed by a dry film-forming method such as a vacuum deposition method and a CVD method, and followed by disposing the counter electrode thereon.

(C) Counter Electrode

The counter electrode is the counter electrically conductive layer, which is supported by the substrate, if necessary. Examples of the electrically conductive material used for the counter electrically conductive layer include: metals such as platinum, gold, silver, copper, aluminum, magnesium and indium; carbon; and electrically conductive metal oxides such as indium-tin composite oxides and fluorine-doped tin oxides. Among them, preferred are platinum, gold, silver, copper, aluminum and magnesium. The substrate of the counter electrode is preferably made of a glass or a plastic to be coated or vapor-deposited with the electrically conductive material. The counter electrically conductive layer preferably has a thickness of 3 nm to 10 $\mu$m, although the thickness is not particularly limited. The surface resistance of the counter electrically conductive layer is desirably as low as possible. The surface resistance is preferably 50$\Omega$/square or less, more preferably 20$\Omega$/square or less.

Light may be irradiated from any one or both side of the conductive support and the counter electrode, so that at least one of them should be substantially transparent to have light reached to the photosensitive layer. From a viewpoint of improving electric generation efficiency, it is preferable that the conductive support is substantially transparent to irradiate light therethrough. In this case, the counter electrode preferably has a light-reflective property. Such a counter electrode may be composed of a glass or a plastic having a vapor-deposited layer of metal or electrically conductive oxide, or metal thin film.

The counter electrode may be disposed by applying, metal-plating or vapor-depositing (PVD, CVD, etc.) the electrically conductive material directly onto the ion-conductive electrolyte layer. It is preferable that the metal lead is used to reduce the resistance of the counter electrode, as is similar to the conductive support. The metal lead is particularly preferably used for the transparent counter electrode. Preferable embodiments of the metal lead used for the counter electrode are the same as those of the metal lead used for the conductive support mentioned above.

(F) Others

Functional layers such as a protective layer and a reflection-preventing layer may be disposed on any one or both of the conductive support and the counter electrode. The functional layers may be disposed by a method selected in accordance with the materials therefor, such as a coating method, a vapor-deposition method and a sticking method.

(G) Interior Structure of Differential Response Light-receiving Device

As described above, the differential response light-receiving device may have various interior structures in accordance with an end of use. The structures are classified into two major forms, a structure allowing light incidence from both faces, and a structure allowing it from only one face. Each of FIGS. 2 to 9 illustrates an example of the interior structure of the differential response light-receiving device, which is preferable in the present invention.

Figure 2:
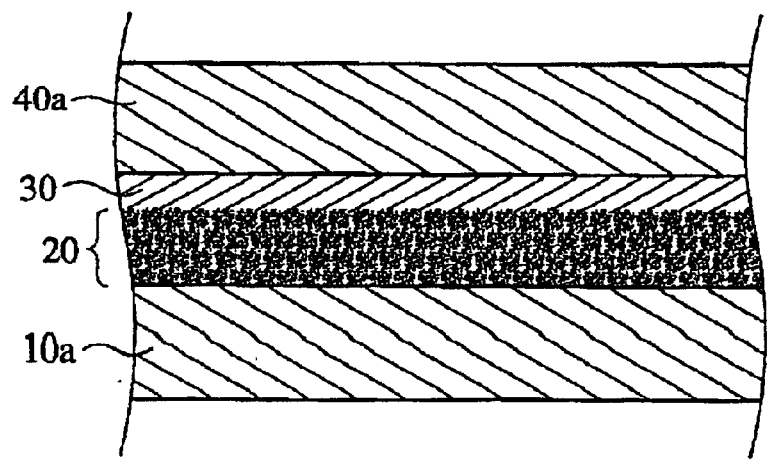
FIG. 2 is a partial cross sectional view showing an example of the differential response light-receiving device of the present invention.

In the structure illustrated in FIG. 2, the photosensitive layer 20 and the ion-conductive electrolyte layer 30 are disposed between the transparent electrically conductive layer 10a and the transparent counter electrically conductive layer 40a. This structure allows light incidence from both faces of the device.

Figure 3:
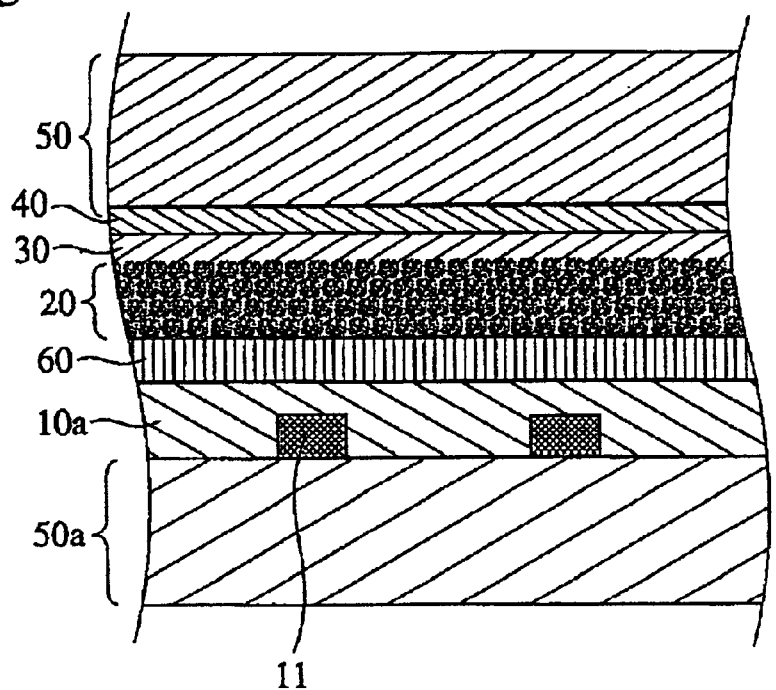
FIG. 3 is a partial cross sectional view showing an example of the differential response light-receiving device of the present invention.

In the structure illustrated in FIG. 3, on the transparent substrate 50a partially having the metal lead 11 is disposed the transparent electrically conductive layer 10a, the undercoating layer 60, the photosensitive layer 20, the ion-conductive electrolyte layer 30 and the counter electrically conductive layer 40 are laminated in this order, and the substrate 50 is further placed thereon. This structure allows light incidence from the electrically conductive layer side.

Figure 4:
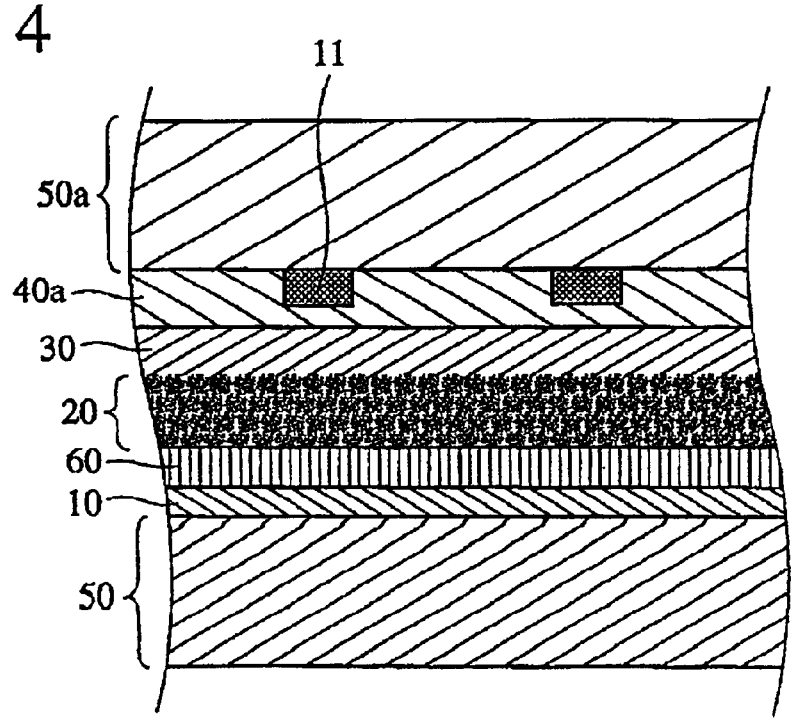
FIG. 4 is a partial cross sectional view showing an example of the differential response light-receiving device of the present invention.

In the structure illustrated in FIG. 4, the photosensitive layer 20 is disposed on the substrate 50 having the electrically conductive layer 10 through the undercoating layer 60, the ion-conductive electrolyte layer 30 and the transparent counter electrically conductive layer 40a are disposed thereon, and further the transparent substrate 50a locally, having the metal lead 11 is placed on the counter electrically conductive layer 40a so that the metal lead 11 side orients inward. This structure allows light incidence from the counter electrode side.

Figure 5:
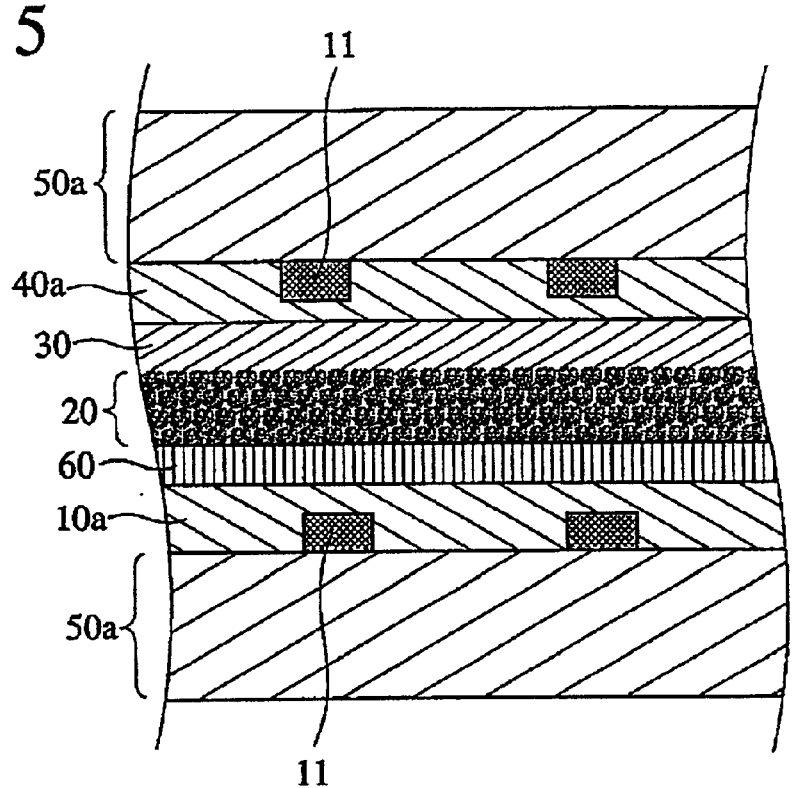
FIG. 5 is a partial cross sectional view showing an example of the differential response light-receiving device of the present invention.

In the structure illustrated in FIG. 5, on the two transparent substrates 50a each having the metal lead 11 partially are formed the transparent electrically conductive layer 10a and the transparent counter electrically conductive layer 40a, respectively, and the undercoating layer 60, the photosensitive layer 20 and the ion-conductive electrolyte layer 30 placed between the conductive layers. This structure allows light incidence from both faces of the photoelectric conversion device.

Figure 6:
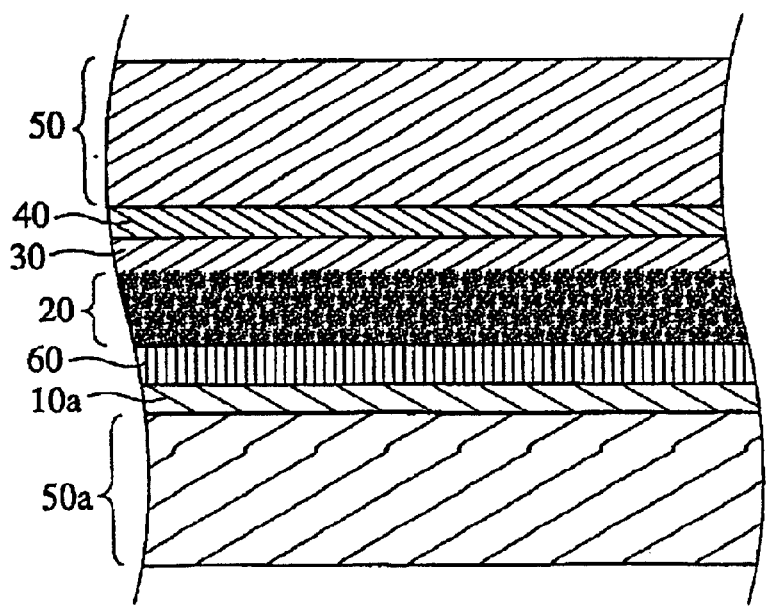
FIG. 6 is a partial cross sectional view showing an example of the differential response light-receiving device of the present invention.

In the structure illustrated in FIG. 6, on the transparent substrate 50a having the transparent electrically conductive layer 10a is disposed the photosensitive layer 20 through the undercoating layer 60, the ion-conductive electrolyte layer 30 and the counter electrically conductive layer 40 are formed thereon, and further the substrate 50 is placed on the counter electrically conductive layer 40. This structure allows light incidence from the electrically conductive layer side.

Figure 7:
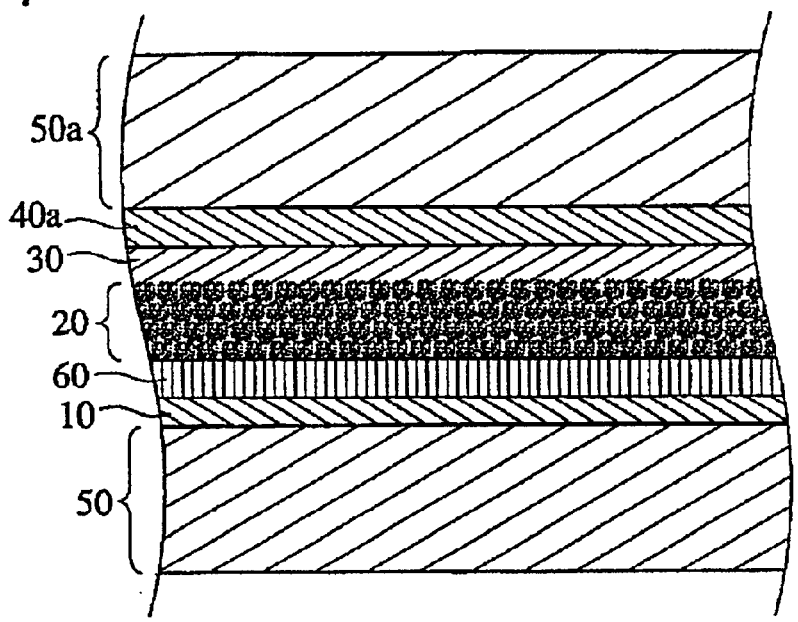
FIG. 7 is a partial cross sectional view showing an example of the differential response light-receiving device of the present invention.

In the structure illustrated in FIG. 7, on the substrate 50 having the electrically conductive layer 10 is disposed the photosensitive layer 20 through the undercoating layer 60, the ion-conductive electrolyte layer 30 and the transparent counter electrically conductive layer 40a are formed thereon, and further the transparent substrate 50a is placed on the layer 40a. This structure allows light incidence from the counter electrode side.

Figure 8:
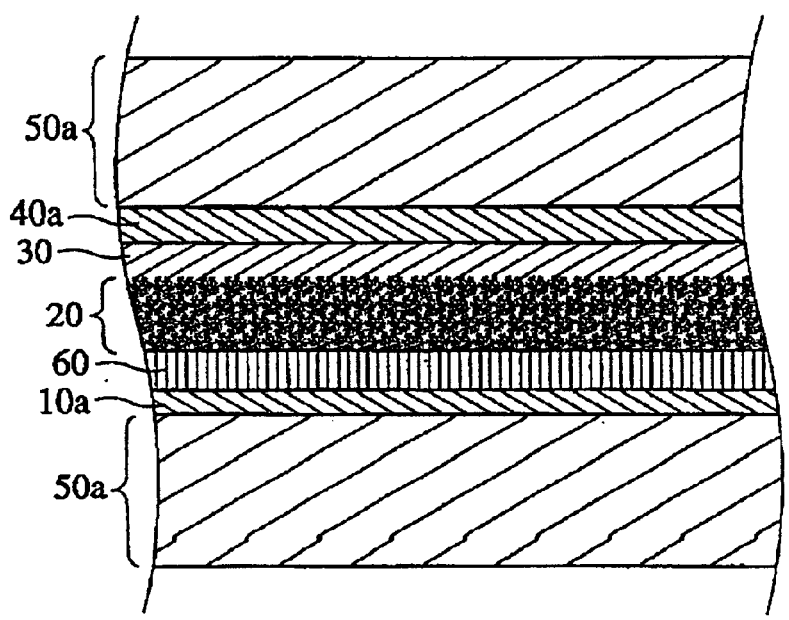
FIG. 8 is a partial cross sectional view showing an example of the differential response light-receiving device of the present invention.

In the structure illustrated in FIG. 8, on the transparent substrate 50a having the transparent electrically conductive layer 10a is disposed the photosensitive layer 20 through the undercoating layer 60, the ion-conductive electrolyte layer 30 and the transparent counter electrically conductive layer 40a are formed thereon, and further the transparent substrate 50a is placed on the layer 40a. This structure allows light incidence from both faces of the photoelectric conversion device.

Figure 9:
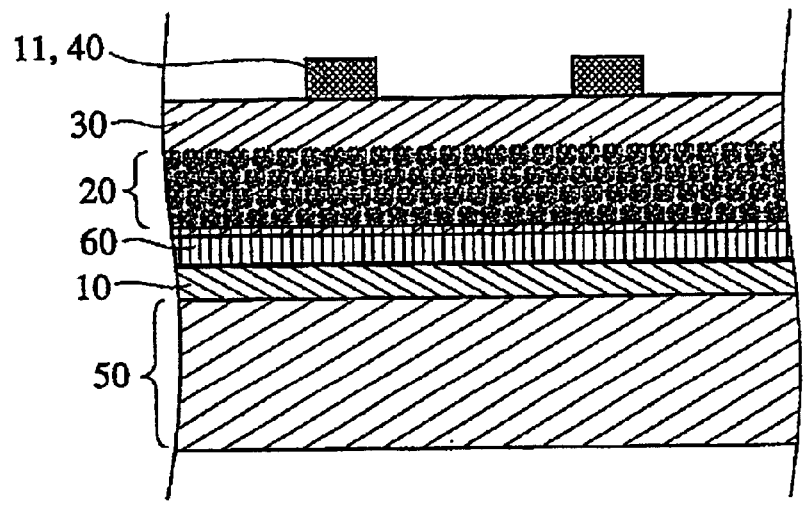
FIG. 9 is a partial cross sectional view showing an example of the differential response light-receiving device of the present invention.

In the structure illustrated in FIG. 9, the photosensitive layer 20 is disposed on the substrate 50 having the electrically conductive layer 10 through the undercoating layer 60, the solid ion-conductive electrolyte layer 30 is disposed thereon, and further the counter electrically conductive layer 40 or the metal lead 11 is locally placed on the solid ion-conductive electrolyte layer 30. This structure allows light incidence from the counter electrode side.

[2] Color Photosensor

The differential response light-receiving device of the present invention may be used for a color photosensor. The color photosensor is composed of the differential response light-receiving device comprising a plurality of semiconductor electrodes arranged in a direction of light incident. Photosensitive wavelengths of the semiconductor electrodes are different from each other.

Thus, the color photosensor using the differential response light-receiving device of the present invention comprises: a plurality of semiconductor electrodes, photosensitive wavelengths thereof being different from each other; at least one counter electrode; and the ion-conductive electrolyte layer that is free of the redox species and is disposed between the semiconductor electrodes and the counter electrode. Components of the layers may be diffused and mixed in a boundary of each layer.

The color photosensor may comprise: a plurality of counter electrodes, which correspond to any of the semiconductor electrodes, respectively; or only one counter electrode used as a "common counter electrode" for the semiconductor electrodes. In the case of using the common counter electrode, because the semiconductor electrodes should electrically come into contact with the common counter electrode through the ion-conductive electrolyte layer, a leak (pore) may be provided in the semiconductor electrodes and/or the common counter electrode.

The color photosensor may comprise one or more substrate. The semiconductor electrode or the counter electrode may be disposed on only one side or the both sides of the substrate.

To make incident light reach to all of the semiconductor electrodes of the color photosensor, it is preferable that the semiconductor electrode arranged the nearest to the light incidence side surface of the color photosensor (hereinafter referred to as "an uppermost semiconductor electrode") is substantially transparent. Also, it is preferred that the other semiconductor electrodes, the counter electrode, etc. disposed nearer to the light incidence side surface than the semiconductor electrode arranged the farthest therefrom (hereinafter referred to as "a lowest semiconductor electrode") is substantially transparent. The photosensitive layer of the lowest semiconductor electrode may be opaque, and it is preferable that the electrically conductive layer of the lowest semiconductor electrode is substantially transparent if it is disposed nearer to the light incidence side surface than the photosensitive layer. In the case where the counter electrode is disposed farther from the light incidence side surface than the lowest semiconductor electrode, the counter electrode may be opaque. Incidentally, the term "substantially transparent" means that light transmittance is 10% or more. The light transmittance is preferably 50% or more, particularly preferably 70% or more.

In the color photosensor, at least one of the semiconductor electrodes comprises the electrically conductive layer and the photosensitive layer containing the semiconductor sensitized by the dye. To improve spectral properties of the color photosensor, each of the semiconductor electrodes preferably has a sharp spectral sensitivity. Specifically, the color photosensor preferably comprises: a semiconductor electrode having a dye-sensitized photosensitive layer remarkably sensitive to a blue light (hereinafter referred to as "blue-sensitive semiconductor electrode"); a semiconductor electrode having a dye-sensitized photosensitive layer remarkably sensitive to a green light (hereinafter referred to as "green-sensitive semiconductor electrode"); and a semiconductor electrode having a dye-sensitized photosensitive layer remarkably sensitive to a red light (hereinafter referred to as "red-sensitive semiconductor electrode"). In the case where a semiconductor electrode that has a photosensitive layer comprising no dye is used for the color photosensor, a semiconductor exhibiting a photosensitivity to a light in visible wavelength range is preferably used for the photosensitive layer, and CdS, CdSe, GaAs, GaP, Si, etc. are preferably used as such a semiconductor.

In the color photosensor, the semiconductor electrodes are preferably arranged in such order that the photosensitive wavelengths thereof are increasing from light incident side of the differential response light-receiving device. In the case where the color photosensor comprises the blue-sensitive semiconductor electrode, the green-sensitive semiconductor electrode and the red-sensitive semiconductor electrode, these semiconductor electrodes are preferably arranged in this order from the light incident side.

Figure 10:
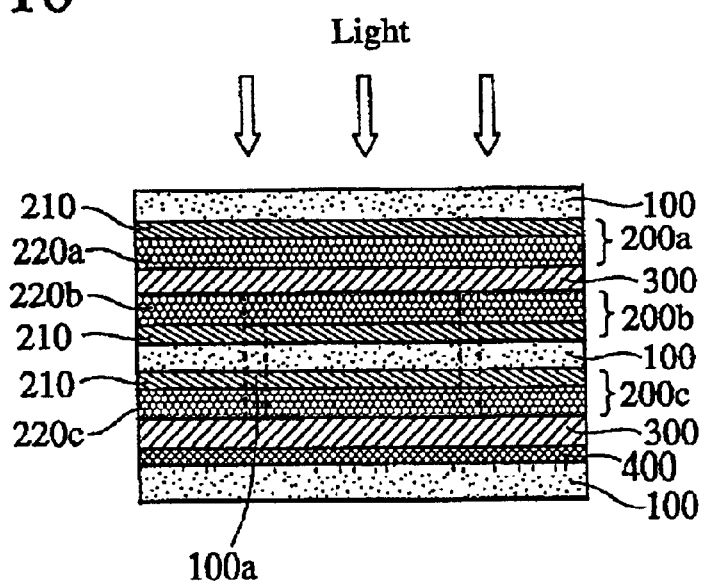
FIG. 10 is a cross sectional view showing an example of color photosensor using the differential response light-receiving device of the present invention.
Figure 11:
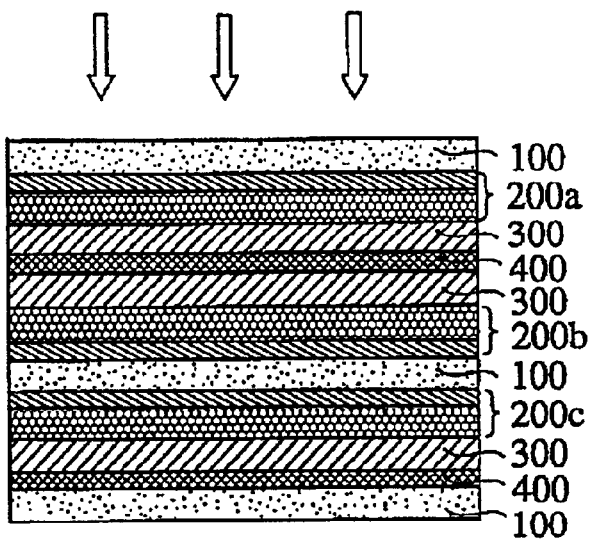
FIG. 11 is a cross sectional view showing an example of color photosensor using the differential response light-receiving device of the present invention.
Figure 12:
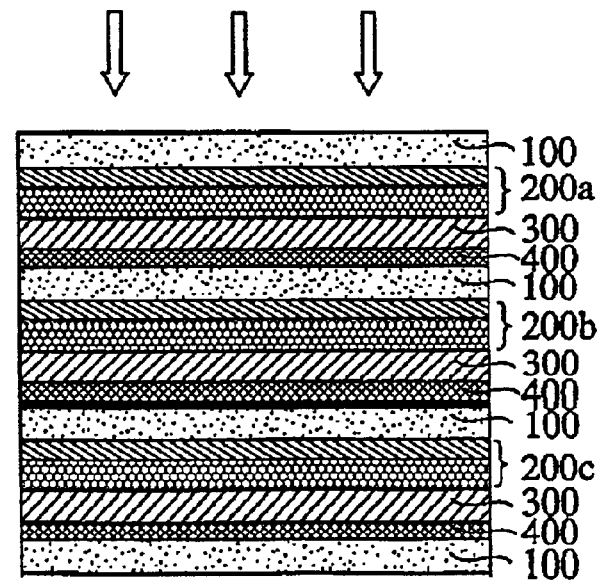
FIG. 12 is a cross sectional view showing an example of color photosensor using the differential response light-receiving device of the present invention.

Structure of the color photosensor using the differential response light-receiving device of the present invention may be selected from various structures in accordance with its use as shown in FIGS. 10 to 12.

FIG. 10 shows an example of the color photosensor using the differential response light-receiving device of the present invention, where three semiconductor electrodes and one common counter electrode are used. The color photosensor of FIG. 10 comprises three transparent substrates 100; a transparent, blue-sensitive semiconductor electrode 200a is disposed on the under surface of the first transparent substrate 100; a transparent, green-sensitive semiconductor electrode 200b is disposed on the upper surface of the second transparent substrate 100; a red-sensitive semiconductor electrode 200c is disposed on the under surface of the second transparent substrate 100; a counter electrode 400 is disposed on the upper surface of the third transparent substrate 100; and ion-conductive electrolyte layers 300 are disposed between the blue-sensitive semiconductor electrode 200a and the green-sensitive semiconductor electrode 200b, and between the red-sensitive semiconductor electrode 200c and the counter electrode 400. Leaks 100a are provided in the green-sensitive semiconductor electrode 200b, the second transparent substrate 100 and the red-sensitive semiconductor electrode 200c, whereby the blue-sensitive semiconductor electrode 200a, the green-sensitive semiconductor electrode 200b, the red-sensitive semiconductor electrode 200c and the counter electrode 400 electrically come into contact with each other through the ion-conductive electrolyte layer. Light is irradiated from the blue-sensitive semiconductor electrode 200a side, partially transmitted through the blue-sensitive semiconductor electrode 200a to the green-sensitive semiconductor electrode 200b, and then reaches to the red-sensitive semiconductor electrode 200c. Incidentally, the blue-sensitive semiconductor electrode 200a is composed of an electrically conductive layer 210 and a blue-photosensitive layer 220a, the green-sensitive semiconductor electrode 200b is composed of an electrically conductive layer 210 and a green-photosensitive layer 220b, and the red-sensitive semiconductor electrode 200c is composed of an electrically conductive layer 210 and a red-photosensitive layer 220c.

FIG. 11 shows an example of the color photosensor using the differential response light-receiving device of the present invention, where three semiconductor electrodes and two counter electrodes are used. The color photosensor of FIG. 11 comprises three transparent substrates 100; a transparent, blue-sensitive semiconductor electrode 200a, an ion-conductive electrolyte layer 300, a transparent counter electrode 400 and an ion-conductive electrolyte layer 300 are laminated in this order on the under surface of the first transparent substrate 100; a transparent, green-sensitive semiconductor electrode 200b is disposed on the upper surface of the second transparent substrate 100; a red-sensitive semiconductor electrode 200c is disposed on the under surface of the second transparent substrate 100; a counter electrode 400 and an ion-conductive electrolyte layer 300 are laminated in this order on the upper surface of the third transparent substrate 100; and these laminates are adhered.

FIG. 12 shows an example of the color photosensor using the differential response light-receiving device of the present invention, where three semiconductor electrodes and three counter electrodes each corresponding thereto ate used. The color photosensor of FIG. 12 comprises four transparent substrates 100; a transparent, blue-sensitive semiconductor electrode 200a is disposed on the under surface of the first transparent substrate 100; a transparent counter electrode 400 is disposed on the upper surface of the second transparent substrate 100; a transparent, green-sensitive semiconductor electrode 200b is disposed on the under surface of the second transparent substrate 100; a transparent counter electrode 400 is disposed on the upper surface of the third transparent substrate 100; a red-sensitive semiconductor electrode 200c is disposed on the under surface of the third transparent substrate 100; a counter electrode 400 is disposed on the upper surface of the fourth transparent substrate 100; and ion-conductive electrolyte layers 300 are disposed between the semiconductor electrodes and the counter electrodes, respectively.

The structure of the color photosensor using the differential response light-receiving device is not limited to such that shown in FIGS. 10 to 12, and various modifications may be made in the structures, such as change of the lamination order, reduction or increase of the semiconductor electrode, etc.

In the color photosensor, each of the semiconductor electrodes outputs a photoelectric current corresponding to intensity of light, to which the semiconductor electrode has sensitivity. The light can be sensed with respect to color (or wavelength) and intensity by detecting each photoelectric current in the external circuit, etc. Thus, the differential response light-receiving device of the present invention may comprise a plurality of semiconductor electrodes, photosensitive wavelengths thereof being different from each other, therefore, the differential response light-receiving device can be used as the color photosensor while observing the photoelectric current provided from each semiconductor electrode.

The color photosensor mentioned above may be used as a pixel of a color image sensor, in which a plurality of pixels are two-dimensionally arranged. The color image sensor provides two-dimensional image information as electrical signals.

Spatial resolution of the image sensor can be improved by reducing the pixels composed of the color photosensor in size to increase the number of the pixels per an area. In the image sensor, only one common counter electrode may be used correspondingly to all of the pixels, if the semiconductor electrodes of the pixels are electrically insulated from each other.

Figure 13:
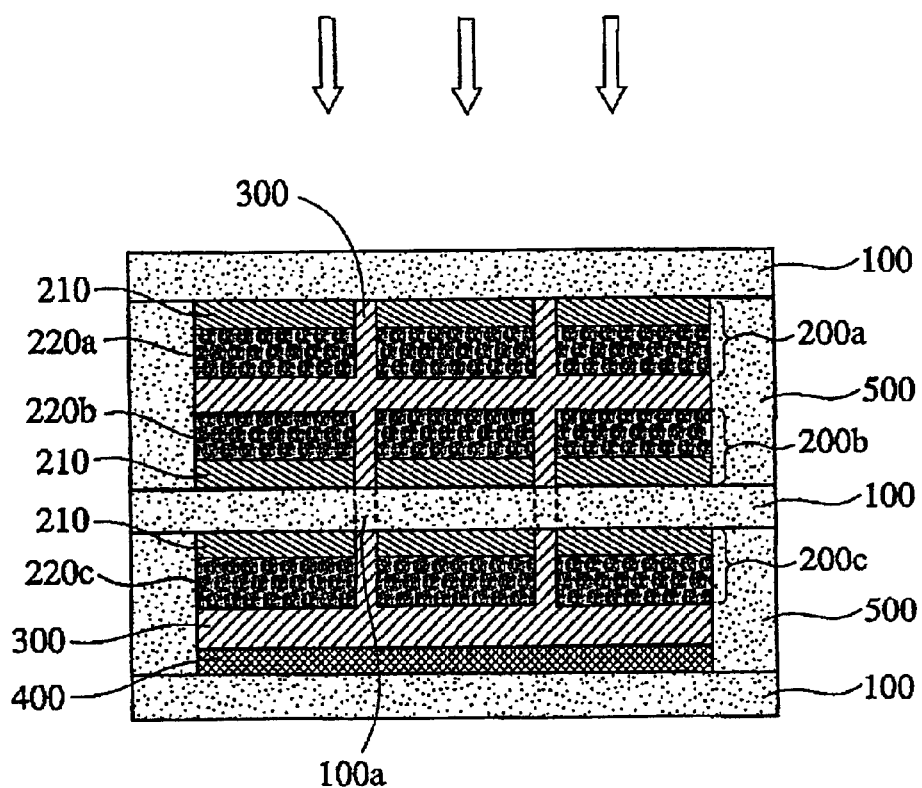
FIG. 13 is a cross sectional, schematic view showing an example of structure of the image sensor according to the present invention.

FIG. 13 is a cross sectional, schematic view showing an example of structure of the image sensor using the differential response light-receiving device of the present invention. The image sensor of FIG. 13 has a simplified structure comprising three blue-sensitive semiconductor electrodes, three green-sensitive semiconductor electrodes and three red-sensitive semiconductor electrodes as pixels. In this image sensor, the first transparent substrate 100 is coated with transparent electrically conductive layers 210 and thereon are disposed blue-photosensitive layers 220a; the both sides of the second transparent substrate 100 are coated with transparent electrically conductive layers 210 and thereon are disposed green-photosensitive layers 220b and red-photosensitive layers 220c, respectively; a common counter electrode 400 is disposed on the third transparent substrate 100; and ion-conductive electrolyte layers 300 are disposed between the semiconductor electrodes 200a, 200b and 200c and the common counter electrode 400, respectively. The blue-photosensitive layers 220a, the green-photosensitive layers 220b and the red-photosensitive layers 220c are electrically come into contact with the common counter electrode 400 through the ion-conductive electrolyte layers 300. Spacers 500 are disposed to spatially isolate the semiconductor electrodes and the common counter electrode. The spaces provided by the spacers 500 are filled with the ion-conductive electrolyte layers 300. The ion-conductive electrolyte layers 300 are connected through leaks 100a with each other, and the leaks 100a are also filled with the ion-conductive electrolyte layers 300. Thus, all of the photosensitive layers come into contact with the counter electrode through the ion-conductive electrolyte layer.

The pixels of the image sensor are electrically independent, and the electrically conductive layers are two-dimensionally patterned so that the photoelectric current provided by each pixel is introduced to a terminal portion of the image sensor.

Light is irradiated from the blue-photosensitive layer side, and mostly absorbed by the blue-photosensitive layer, the green-photosensitive layer and the red-photosensitive layer in this order. A transmitted light and a stray light, which are not absorbed by the photosensitive layers, are absorbed by the common counter electrode 400. The electrically conductive layer 210 may be a transparent electrically conductive film made of tin oxide, indium-tin oxide, etc., and the common counter electrode 400 may be a metal film made of platinum, platinum black, etc.

Figure 14:
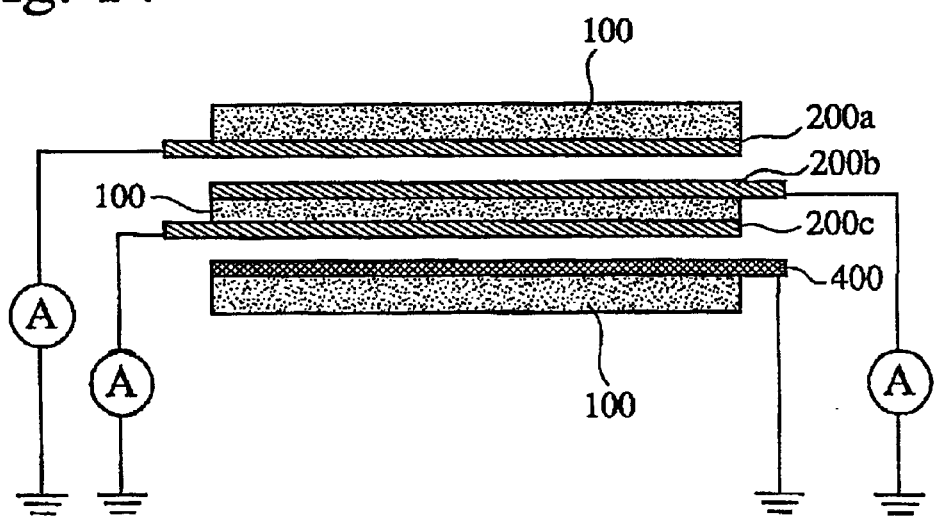
FIG. 14 is a cross sectional, schematic view showing an example of external circuit used with the image sensor according to the present invention.

FIG. 14 is a cross sectional, schematic view showing an example of the external circuit used with the image sensor having only one pixel of the present invention, the external circuit being an equivalent circuit that detects the photoelectric current provided from each of the blue-sensitive semiconductor electrode, the green-sensitive semiconductor electrode and the red-sensitive semiconductor electrode at the same time. The ion-conductive electrolyte layers, which are disposed between the electrodes, are not shown. The photoelectric currents are detected as a short circuit current by ammeters A disposed in the external circuit. An electric current-detecting circuit such as a circuit comprising an operation amplifier and a resistance may be used instead of the ammeter A. Current value is such a value that is obtained by multiplying a current density (A/cm$^2$) in the photosensitive layer by a light-receiving area of the pixel. In this invention, the current density is generally 1 to 100 $\mu$A/cm$^2$ when a light having 1 mW of intensity is irradiated into the photosensitive layer. Further, the current value may be detected by: a method where signals provided by the pixels are detected in a parallel circuit at the same time; a method where two-dimensional array of the pixels is serially scanned to electrically read the signals successively; etc.

[3] Composite Light-receiving Device

A composite light-receiving device of the present invention comprises a combination of the above-mentioned, differential response light-receiving device and a stationary response light-receiving device. In the composite light-receiving device, although the stationary response light-receiving device is not particularly limited, the stationary response light-receiving device preferably comprises: a semiconductor electrode comprising an electrically conductive layer and a photosensitive layer containing a semiconductor sensitized by a dye; a charge transfer layer; and a counter electrode.

To obtain a stationary photoelectric current, the charge transfer layer preferably comprises a hole-transporting material or an electrolyte composition containing redox species. The electrolyte composition containing redox species ay be a composition composed of a reducing agent for reducing dye holes and an oxidizing agent for receiving electrons provided from the counter electrode, etc. Preferred bole-transporting material is a solid material composed of an organic hole-transporting material, an inorganic hole-transporting material and a mixture thereof.

The electrolyte composition containing redox species is preferably prepared by adding iodine $I_2$ and an iodine salt of the organic cation in the above-mentioned molten salt or a metal cation such as $Li^+$, $K^+$, $Na^+$ and $Ce^{2+}$ to the ion-conductive electrolyte composition used for the differential response light-receiving device of the present invention. Weight ration of the iodine salt is preferably 5 to 99.5 weight %, more preferably 10 to 70 weight %, to the total weight of the electrolyte composition. Weight ration of iodine is preferably 0.5 to 30 weight %, more preferably 1 to 20 weight %, to the total weight of the electrolyte composition. To the electrolyte composition may be added the above-mentioned additive used for the ion-conductive electrolyte layer of the differential response light-receiving device.

Examples of preferred organic hole-transporting material used for the stationary response light-receiving device include: aromatic amines described in J. Hagen, et al., Synthetic Metal, 89, 215–220 (1997), Nature, Vol. 395, Oct. 8, 1998, p583–585, WO 97/10617, Japanese Patent Laid-Open No. 59-194393, Japanese Patent Laid-Open No. 5-234681, U.S. Pat. No. 4,923,774, Japanese Patent Laid-Open No. 4-308688, U.S. Pat. No. 4,764,625, Japanese Patent Laid-Open Nos. 3-269084, 4-129271, 4-175395, 4-264189, 4-290851, 4-364153, 5-25473, 5-239455, 5-320634, 6-1972, 7-138562, 7-252474 and 11-144773, etc.; and triphenylenes derivatives described in Japanese Patent Laid-Open Nos. 11-149821, 11-148067 and 11-176489, etc. Further, conductive polymers such as: oligothiophene compounds described in Adv. Mater., 1997, 9, No.7, p557, Angew. Chem. Int. Ed. Engl., 1995, 34, No.3, p303–307, JACS, Vol. 120, No.4, 1998, p664–672, etc.; polypyrrole compounds described in K. Murakoshi, et al., Chem. Lett., 1997, p471; and polyacetylene, poly(p-phenylene), poly(p-phenylenevinylene), polythienylenevinylene, polythiophene, polyaniline, polytoluidine and derivatives thereof described in NALWA, "Handbook of Organic Conductive Molecules and Polymers Vols. 1, 2, 3 and 4" (WILEY) are preferably used as the organic hole-transporting material.

To the organic hole-transporting material may be added a compound containing a cation radical such as tris(4-bromophenyl)aminium hexachloro antimonite to control dopant level as described in Nature, Vol. 395, Oct. 8, 1998, Page 583–585. Further, to the organic hole-transporting material may be added a salt such as $Li[(CF_3SO_2)_2N]$ to potential-control of surface of the semiconductor, thereby compensating a space-charge layer.

The inorganic hole-transporting material used for the stationary response light-receiving device is preferably a p-type inorganic compound semiconductor. Band gap of the p-type inorganic compound semiconductor is preferably 2 eV or more, more preferably 2.5 eV or more. Ionization potential of the p-type inorganic compound semiconductor should be smaller than that of the semiconductor electrode to reduce the dye hole. The ionization potential of the p-type inorganic compound semiconductor may be selected depending on the semiconductor electrode, and generally, it is preferably 4.5 to 5.5 eV, more preferably 4.7 to 5.3 eV. The p-type inorganic compound semiconductor is preferably a compound having a monovalent copper such as CuI, CuSCN, $CuInSe_2$, $Cu(In,Ga)Se_2$, $CuGaSe_2$, $Cu_2O$, CuS, $CuGaS_2$, $CuInS_2$, $CuAlSe_2$, etc. Among them, CuI and CuSCN are preferred, and CuI is the most preferred. GaP, NiO, CoO, FeO, $Bi_2O_3$, $MoO_2$, $Cr_2O_3$, etc. are also used as the p-type inorganic compound semiconductor.

The charge transfer layer composed of the electrolyte composition or the organic hole-transporting material may be provided by a vacuum deposition method, a cast method, a coating method, a spin-coating method, a soaking method, an electrolytic polymerization method, a photo-polymerization method, etc. The charge transfer layer composed of the inorganic solid material may be provided by a cast method, a coating method, a spin-coating method, a soaking method, an electrolytic deposition method, an electroless deposition method, etc.

The semiconductor electrode and the counter electrode used for the stationary response light-receiving device may be the same as those used for the differential response light-receiving device mentioned above. Preferred embodiments thereof are also the same as in the case of the differential response light-receiving device.

In the composite light-receiving device of the present invention, the differential response light-receiving device and the stationary response light-receiving device are arranged horizontally to a light-receiving surface, or stacked in the direction of incident light, whereby a static photo-information and a dynamic photo-information is directly sensed at the same time without a complicated operationed circuit. The differential response light-receiving device and the stationary response light-receiving device are preferably stacked, because in this case, the light-receiving area of the composite light-receiving device can be reduced and positional information of light can be precisely obtained as compared with the case of horizontally arranging the devices.

In the composite light-receiving device of the present invention, the stationary response light-receiving device may comprise a plurality of semiconductor electrodes, photosensitive wavelengths of the semiconductor electrodes being different from each other, the charge transfer layer being disposed between the semiconductor electrodes and the counter electrode. Preferred embodiments of such a stationary response light-receiving device that comprises a plurality of semiconductor electrodes are the same as those of the differential response light-receiving device comprising a plurality of semiconductor electrodes. The differential response light-receiving device used for the composite light-receiving device may comprise a plurality of semiconductor electrodes, photosensitive wavelengths of the semiconductor electrodes being different from each other. Each of the light-receiving devices may be divided into a plurality of pixels. The electrically conductive materials used for the semiconductor electrodes and the counter electrodes of both light-receiving devices may be the same or different. A common counter electrode may be used for both light-receiving devices.

Figure 15:
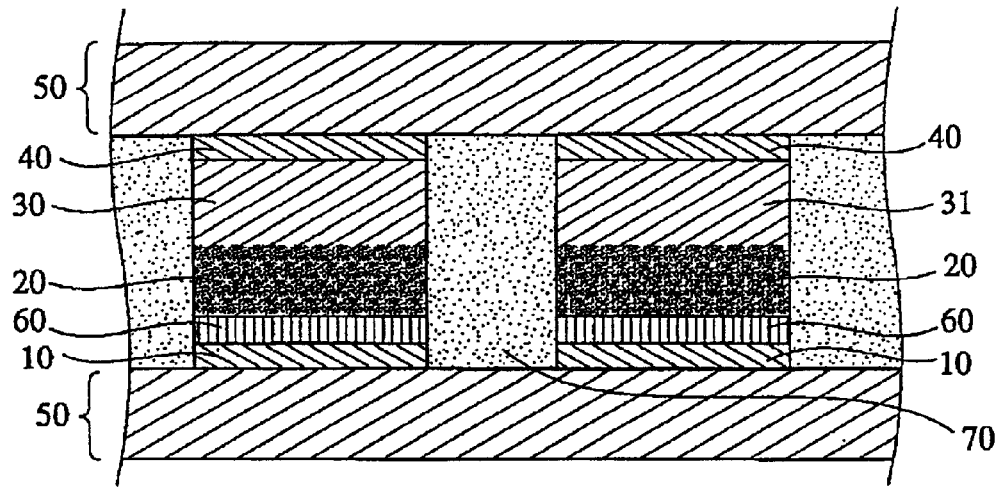
FIG. 15 is a partial cross sectional view showing an example of the composite light-receiving device of the present invention.

FIG. 15 is a partial cross sectional view showing an example of the composite light-receiving device of the present invention, where a differential response light-receiving device and a stationary response light-receiving device are arranged horizontally to the light-receiving surface. In such a composite light-receiving device, an ion-conductive electrolyte layer 30 of the differential response light-receiving device and a charge transfer layer 31 of the stationary response light-receiving device are preferably isolated to make both devices independently act. Each of the semiconductor electrodes of both devices is composed of an electrically conductive layer 10, an undercoating layer 60 and a photosensitive layer 20, and it is preferable that the semiconductor electrodes and/or the counter electrically conductive layers 40 of both light-receiving devices are electrically insulated by an insulator 70. When the semiconductor electrodes of both light-receiving devices are insulated to each other, a common counter electrode may be used for the devices.

Figure 16:
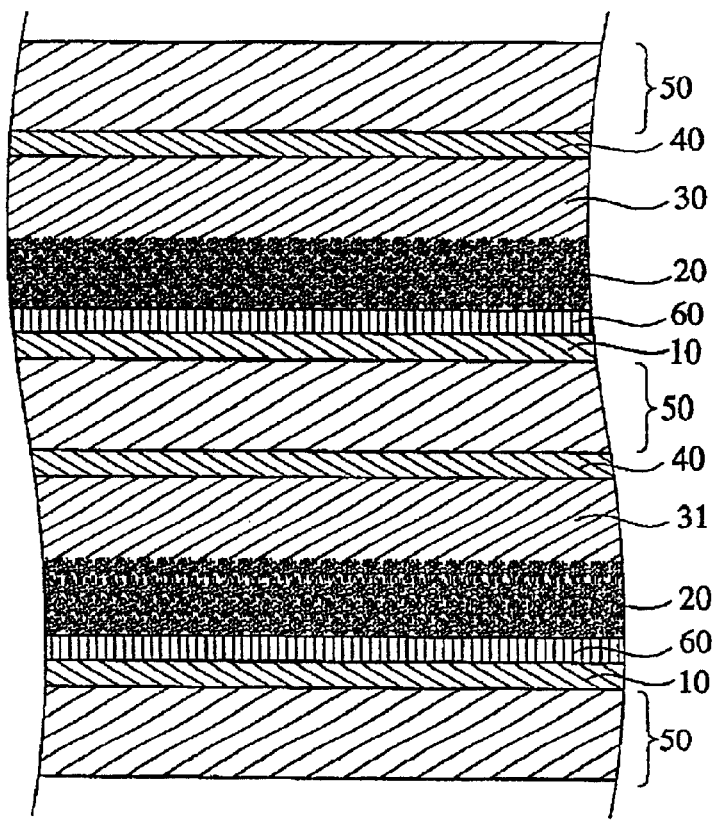
FIG. 16 is a partial cross sectional view showing an example of the composite light-receiving device of the present invention.

FIG. 16 is a partial cross sectional view showing an example of the composite light-receiving device of the present invention, where a differential response light-receiving device is stacked on a stationary response light-receiving device in the direction of light incidence. In such a composite light-receiving device, photosensitive wavelengths of the differential response light-receiving device and the stationary response light-receiving device may be the same or different. The order of stacking is not particularly limited. It is preferred that a light-receiving device disposed nearer to the light incidence side is substantially transparent, and it is particularly preferred that the light-receiving device nearer to the light incidence side has a high transmittivity to a light, to which another light-receiving device is sensitive.

A plurality of composite light-receiving devices may be two-dimensionally arranged as pixels to provide an image sensor capable of sensing a static photo-information and a dynamic photo-information at the same time.

In the case where each of the differential response light-receiving device and the stationary response light-receiving device of the composite light-receiving device comprises a plurality of semiconductor electrodes having a different photosensitive wavelength, the image sensor in which a plurality of the composite light-receiving devices are two-dimensionally arranged as pixels can sense a color information, a static photo-information and a dynamic photo-information at the same time.

EXAMPLES

The present invention will be explained in more detail with reference to examples below without intention of restricting the scope of the present invention.

Example 1

Differential Response Light-receiving Device 1-1. Preparation of Titanium Dioxide Dispersion 15 g of titanium dioxide "Degussa P-25" manufactured by Nippon Aerosil K.K., 45 g of water, 1 g of dispersant "Triton X-100" manufactured by Aldrich, and 30 g of zirconia beads having a diameter of 0.5 mm manufactured by Nikkato K.K. was charged in a stainless steel vessel coated with teflon inside having an inner volume of 200 ml, and subjected to a dispersion treatment for 2 hours at 1500 rpm by means of a sand-grinder mill manufactured by Imex K.K. After the dispersion treatment, the zirconia beads were removed by filtration to obtain a titanium dioxide dispersion. The titanium dioxide particles had an average particle diameter of 2.5 μm, the particle diameter being measured by Master Sizer manufactured by MALVERN.

1-2. Preparation of Dye-sensitized $TiO_2$ Electrode

The above titanium dioxide dispersion was applied to an electrically conductive surface of a conductive glass having a fluorine-doped tin oxide coating by a glass bar. Used as the conductive glass was "TCO Glass-U" manufactured by Asahi Glass K.K. having a surface resistance of approximately 30Ω/square, which was cut into 20 mm×20 mm in size beforehand. Herein, an adhesive tape was attached to the electrically conductive surface of the conductive glass at portions of from the edge to 3 mm as a spacer, eight conductive glasses were arranged such that the adhesive tapes come to both edges thereof, and to the eight conductive glasses were applied the titanium dioxide dispersion at once. The titanium dioxide dispersion-applied conductive glass was air-dried for one day at room temperature after peeling the adhesive tape. The amount of the applied titanium dioxide (semiconductor fine particle) was 20 g/m².

Then, the conductive glass was placed in an electric furnace "muffle furnace FP-32" manufactured by Yamato Science K.K., followed by burning at 450° C. for 30 minutes to obtain a $TiO_2$ electrode. After the $TiO_2$ electrode was taken out of the electric furnace and cooled, it was immersed in an ethanol solution comprising the dye R-1 for 3 hours so that the dye is adsorbed on the titanium dioxide, further immersed in 4-t-butylpyridine for 15 minutes, washed with ethanol and air-dried to obtain a dye-sensitized $TiO_2$ electrode. The concentration of the dye R-1 in the ethanol solution was $3×10^{-4}$ mol/l, and the thickness of thus-obtained photosensitive layer was 10 μm.

1-3. Production of Differential Response Light-receiving Device

The 20 mm×20 mm in size of the dye-sensitized $TiO_2$ electrode prepared as described above was put on a platinum-deposited glass having the same size. Then, an electrolyte composition E-101 shown in Table 1 was permeated into a crevice between the glasses through capillarity and introduced into the dye-sensitized $TiO_2$ electrode, to obtain a differential response light-receiving device P-101.

Photoelectric conversion devices P-102 to P-110 were produced in the same manner as the device P-101 except that electrolyte compositions and dyes shown in Tables 1 were used instead of the electrolyte composition E-101 and the dye R-1, respectively. Structures of dyes DB-1, DG-1 and DR-1 shown in table 1 are illustrated below.

TABLE 1

| Light-Receiving Device | Electrolyte Composition | Dye | Contents of Electrolyte Composition |
|---|---|---|---|
| P-101 | E-101 | R-1 | $LiN(SO_2CF_3)_2$ (0.5 M)/Methoxyacetonitrile |
| P-102 | E-102 | R-1 | $Bu_4NClO_4$ (0.5 M)/Methoxyacetonitrile |
| P-103 | E-103 | R-1 | $Bu_4NBF_4$ (0.5 M)/Methoxyacetonitrile |
| P-104 | E-104 | R-1 | Y6-1 (0.5 M)/Methoxyacetonitrile |
| P-105 | E-105 | R-1 | Y6-2 (0.5 M)/Methoxyacetonitrile |
| P-106 | E-106 | R-1 | Y6-1 |
| P-107 | E-107 | R-1 | Y6-1 |
| P-108 | E-108 | DB-1 | $LiN(SO_2CF_3)_2$ (0.5 M)/Methoxyacetonitrile |
| P-109 | E-109 | DG-1 | $LiN(SO_2CF_3)_2$ (0.5 M)/Methoxyacetonitrile |
| P-110 | E-110 | DR-1 | $LiN(SO_2CF_3)_2$ (0.5 M)/Methoxyacetonitrile |

(DB-1)

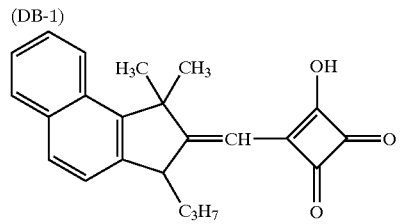

(DG-1)

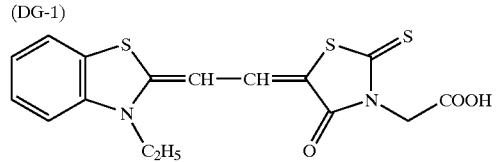

(DR-1)

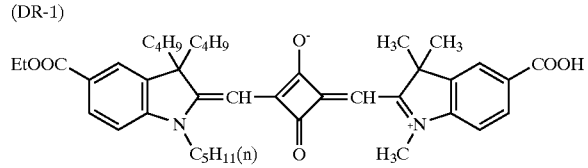

1-4. Measurement of Photoelectric Current

Figure 17:
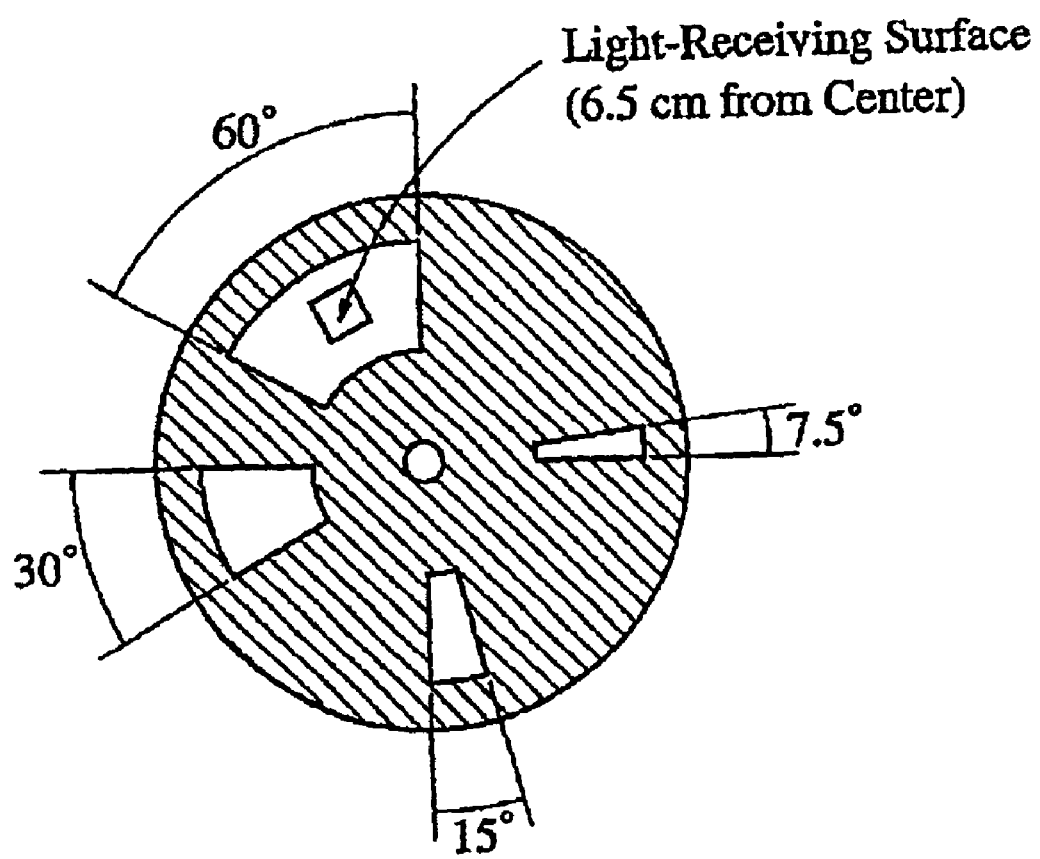
FIG. 17 is a schematic view showing the disc having slits used in Example 1.

Photoelectric current provided by each of the above differential response light-receiving devices was detected as follows:

A square mask of 0.5 cm×0.5 cm in size was disposed on the semiconductor electrode side of the differential response light-receiving device, and a disk having slits shown in FIG. 17 was placed between the differential response light-receiving device and a light source of a lamp (92 mW). The semiconductor electrode of the differential response light-receiving device was connected to a plus terminal of a digital multimeter (ammeter), the counter electrode of the differential response light-receiving device was connected to a minus terminal thereof, and light was irradiated to the light-receiving device while rotating the disk to detect the photoelectric current.

The relation between quantity of light and the photoelectric current provided by the differential response light-receiving device P-101 when the disk was rotated 20 turns per 20 seconds at 60 rpm was shown in FIGS. 18(*a*) and 18(*b*). As shown in FIGS. 18(*a*) and 18(*b*), the differential response light-receiving device P-101 made a time-differential response to the quantity of light to output the photoelectric current. The differential response light-receiving devices P-102 to P-110 also made a time-differential response to the quantity of light to output photoelectric current. Photoelectric current values provided by each device were shown in Table 2. Incidentally, "On" shown in FIG. 18(*b*) and Table 2 means such a state that light was irradiated to the differential response light-receiving device, and "Off" shown in FIG. 18(*b*) and Table 2 means such a state that light was not irradiated thereto.

TABLE 2

| Light-Receiving Device | Photoelectric Current Value ($\mu$A, Average Value) | | | | | | | |
|---|---|---|---|---|---|---|---|---|
| | (A) On | (A) Off | (B) On | (B) Off | (C) On | (C) Off | (D) On | (D) Off |
| P-101 | 70 | −21 | 62 | −21 | 42 | −21 | 50 | −18 |
| P-102 | 56 | −25 | 66 | −23 | 61 | −23 | 70 | −23 |
| P-103 | 81 | −42 | 65 | −35 | 45 | −38 | 63 | −25 |
| P-104 | 25 | −21 | 24 | −22 | 28 | −20 | 25 | −20 |
| P-105 | 66 | −21 | 78 | −34 | 65 | −21 | 56 | −20 |
| P-106 | 10 | −15 | 20 | −16 | 10 | −11 | 6 | −10 |
| P-107 | 150 | −22 | 120 | −30 | 141 | −22 | 100 | −15 |
| P-108 | 45 | −18 | 56 | −21 | 48 | −23 | 45 | −20 |
| P-109 | 65 | −22 | 77 | −23 | 66 | −20 | 46 | −21 |
| P-110 | 55 | −18 | 46 | −17 | 47 | −24 | 34 | −16 |

As is clear from Table 2, the differential response light-receiving device of the present invention is remarkably sensitive to quantity of light.

Example 2

Image Sensor Using Differential Response Light-receiving Device 2-1. Preparation of Transparent Electrically Conductive Glass Substrate Fluorine-doped, conductive fin dioxide was vapor-deposited on a surface of a non-alkali glass plate having a thickness of 1.9 mm by CVD method while using a photomask for patterning, to prepare a transparent electrically conductive glass substrate having a patterned, electrically conductive layer shown in FIG. 19. The electrically conductive layer was composed of: 64 square pixels 610 of 2.5 mm×2.5 mm in size; output terminals 620 placed in edges of the substrate; and wirings 630 having a width of 100 $\mu$m connecting the pixels 610 to the output terminals 620. The electrically conductive layer had a thickness of 600 nm, a surface resistance of 10Ω/square, and a light transmittance at 500 nm of 85%. Then, the wirings of the electrically conductive layer were coated with an insulated, vapor-deposited silicon dioxide film having a thickness of 100 nm by a photoresist method.

2-2. Preparation of Blue-sensitive Semiconductor Electrode

Figure 19:
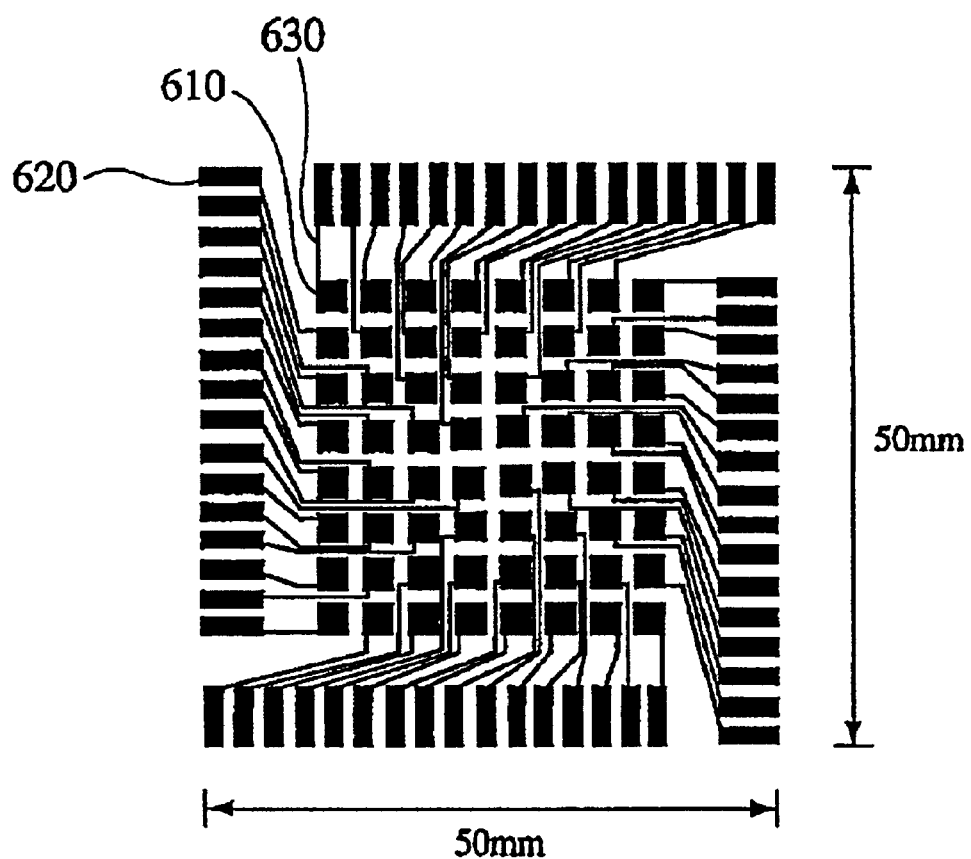
FIG. 19 is a schematic view showing an example of patterning pixels and wirings used for the image sensor of the present invention.

The titanium dioxide dispersion prepared in Example 1 was applied to the electrically conductive layer except for the output terminals by a doctor blade method into a thickness of 70 $\mu$m. The titanium dioxide dispersion-applied, transparent electrically conductive glass substrate was dried for 60 minutes at 25° C., followed by burning at 450° C. for 30 minutes by means of a furnace. The amount of the applied titanium dioxide (semiconductor fine particle) was 7 g/m$^2$, and thus-obtained titanium dioxide layer had a thickness of 3 $\mu$m. Then, the titanium dioxide layer was patterned into 64 square pixels as shown in FIG. 19 by a photoresist method. Incidentally, a mixed solution of concentrated sulfuric acid and ammonium sulfate was used for etching the titanium dioxide layer.

Then, the transparent electrically conductive glass substrate having the titanium dioxide layer was immersed in a solution composed of a blue-sensitive polymethine dye DB-1 (0.1 mM), chenodeoxycholic acid (20 mM) and a mixed solvent of dimethyl sulfoxide (DMSO)/ethanol=1/20 for 10 hours at 40° C. while stirring. The transparent electrically conductive glass substrate was washed with ethanol and dried to prepare a blue-sensitive semiconductor electrode having a blue-photosensitive layer. Amount of the adsorbed dye was approximately 5×10$^{-4}$ mol per 1 m$^2$ of the titanium dioxide layer.

2-3. Preparation of Green-sensitive Semiconductor Electrode and Red-sensitive Semiconductor Electrode Fluorine-doped, conductive tin dioxide was vapor-deposited on both surfaces of a non-alkali glass plate having a thickness of 50 $\mu$m in the same manner as above "2-1.", to prepare a transparent electrically conductive glass substrate having patterned, electrically conductive layers shown in FIG. 19. Then, the wirings of each electrically conductive layer were coated with an insulated, vapor-deposited silicon dioxide film having a thickness of 100 nm by a photoresist method. Incidentally, the fluorine-doped, conductive tin dioxide was vapor-deposited such that the pixels of one electrically conductive layer were geometrically overlapped with the pixels of another electrically conductive layer. Next, the titanium dioxide dispersion prepared in Example 1 was applied to the electrically conductive layers and patterned in the same manner as above "2-1.", whereby a titanium dioxide layer for a green-photosensitive layer having a thickness of 3 $\mu$m was disposed on one surface of the transparent electrically conductive glass substrate, and a titanium dioxide layer for a red-photosensitive layer having a thickness of 4 $\mu$m was disposed on another surface thereof. Then, in the transparent electrically conductive glass substrate, leaks (pores) having a diameter of 100 $\mu$m were provided between each adjacent pixels at regular intervals by means of an our own scraping apparatus and laser. Each of the leaks acts as a channel, which an electrolyte passes through.

The transparent electrically conductive glass substrate was sandwiched between two square shaped cells of teflon and fixed thereto such that the openings of the square shaped cells were in the same direction. Two dye solutions were injected into chambers of the square shaped cells, respectively, whereby both faces of the transparent electrically conductive glass substrate were immersed in a different dye solution, respectively. The dye solution for the green-photosensitive layer was composed of an Ru complex green-sensitive dye DG-2 shown below (0.3 mM) and a mixed solvent of acetonitrile/t-butanol=1/1, and the dye solution for the red-photosensitive layer was composed of an Ru complex red-sensitive dye DR-2 shown below (5×10$^{-5}$ mol/l) and a mixed solvent of DMSO/ethanol=1/10. The transparent electrically conductive glass substrate was immersed in the dye solutions for 10 hours at 40° C. to be adsorbed with the dye. Thus-obtained green-photosensitive layer and red-photosensitive layer were rinsed with ethanol and dried to prepare a green-sensitive semiconductor electrode and a red-sensitive semiconductor electrode.

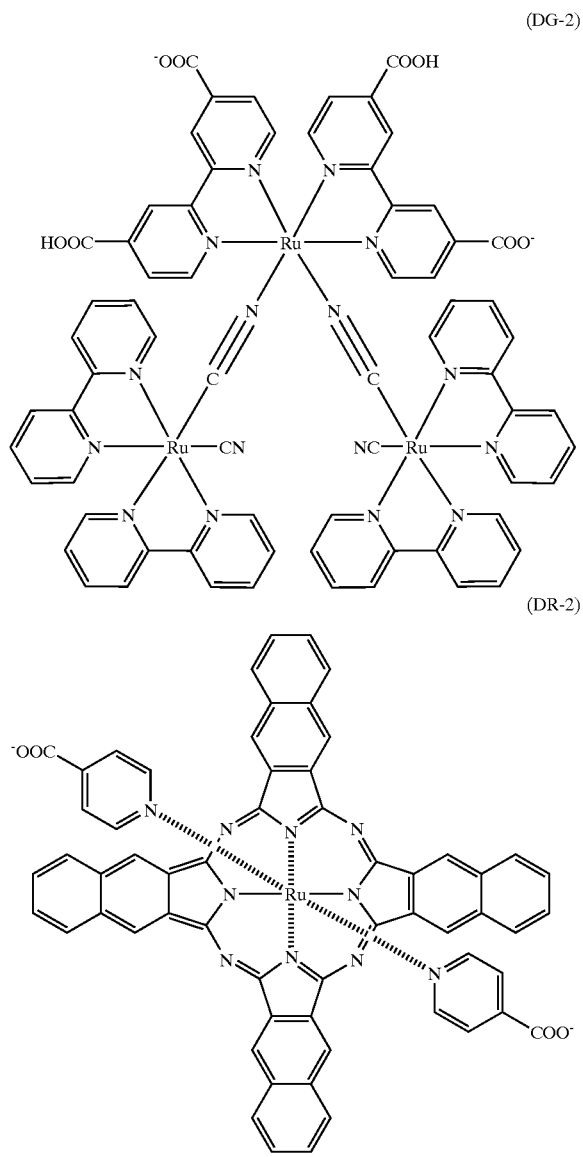

2-4. Production of Image Sensor

A heat-shrinkable resin sheet "FUSABOND" manufactured by Du Pont having a thickness of 25 μm and a width of 2 mm was disposed around the blue-photosensitive layer as a spacer. The green-photosensitive layer side of the above-mentioned transparent electrically conductive glass substrate having the green-photosensitive layer and the red-photosensitive layer was disposed on the blue-photosensitive layer through the spacer such that the pixels of the green-photosensitive layer were overlapped to the pixels of the blue-photosensitive layer. Further, on the red-photosensitive layer side of the above-mentioned transparent electrically conductive glass substrate was disposed the heat-shrinkable resin sheet, and thereon was disposed a glass substrate coated with a platinum-deposited film as a common counter electrode. The resultant laminate was heated at 130° C. for 20 seconds while mechanically applying a pressure in a direction of thickness to melt and fuse the spacers.

Then, the molten salt electrolyte Y6-2 was injected from openings of the spacers and penetrated between the electrodes through capillarity at 60° C. to fill spaces between the electrodes with the electrolyte Y6-2, whereby a differential response light-receiving device comprising three semiconductor electrodes was produced. Incidentally, stack of the electrodes and injection of the electrolyte were carried out under a dry air having a dew point of −60° C. After the injection of the electrolyte, the differential response light-receiving device was degasified under a vacuum condition for a several hours. Finally, the differential response light-receiving device was sealed by an epoxy adhesive except for the output terminals, to produce an image sensor.

The resulting image sensor had a light-receiving area of 12.3 cm$^2$, a thickness of approximately 3.9 mm, and an essential structure similar to that of FIG. 14. The image sensor comprised the blue-photosensitive layer, the green-photosensitive layer and the red-photosensitive layer each having 64 pixels, where 192 output terminals corresponding to the pixels appear on the outside of the light-receiving surface. The output terminals of the image sensor were connected to a parallel circuit of an operation amplifier for measuring a short circuit current, to prepare a model system used for sensing a color image of 64 pixels.

2-5. Measurement of Photoelectric Current and Sensing of Color Image Information Photoelectric current provided by each pixel of the image sensor was measured by a circuit composed of an operation amplifier and a resistance of 1 kΩ while converting direct current (DC) into voltage. A current signal of 1 μm was measured as a voltage output of 1 mV by the circuit.

Alphabet images of B, G and R each having a different color were applied to the image sensor by a simple light source composed of a tungsten/halogen lamp of 100 W and an optical system comprising a collimator lens for parallel light irradiation. The alphabet images were detected by the circuit based on the intensity distribution of the photoelectric current, which was provided by two dimensional pixels in each of the blue-photosensitive layer, the green-photosensitive layer and the red-photosensitive layer at the moment when the alphabet images were applied.

FIGS. 20(*a*) to 20(*c*) were diagrams showing the maximum values of the photoelectric currents detected by the circuit, which were provided in response to irradiation of the blue-colored image of "B", the green-colored image of "G" and the red-colored image of "R" by the pixels disposed in each of the blue-photosensitive layer, the green-photosensitive layer and the red-photosensitive layer of the image sensor. In FIGS. 20(*a*) to 20(*c*), a number was not wrote in a pixel that exhibited a voltage output of 10 mV or less.

As shown in FIGS. 20(*a*) to 20(*c*), each of the photosensitive layers of the image sensor detected three images having a different color as electrical signals image-wise, thus, the intensity distributions of the electrical signals corresponded to the light quantity distributions of the irradiated images.

Example 3

Composite Light-receiving Device 3-1. Production of Composite Light-receiving Device As shown in FIG. 21(*a*), two semiconductor electrodes 700 were prepared by cutting the dye-sensitized TiO$_2$ electrode produced in above "1-2." and by partly scraping off the dye-sensitized photosensitive layer 710. As shown in FIG. 21(*b*), a counter electrode 800 was prepared by heat welding spacers 500 of the heat-shrinkable resin sheet "FUSAB- OND" manufactured by Du Pont having a thickness of 25 µm to the both faces of a glass substrate coated with ITO electrically conductive films. Incidentally, inlets were disposed on corner portions of the spacers 500.

Figure 21A:
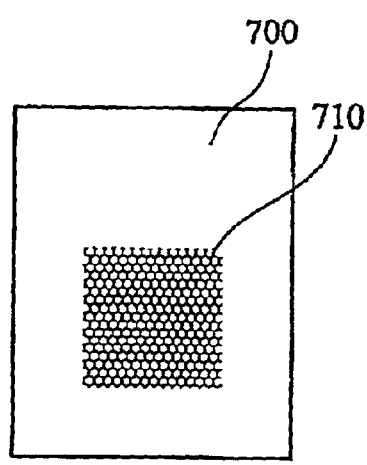
FIGS. 21(a) to 21(d) are schematic views showing production of a composite light-receiving device according to Example 3, where
Figure 21B:
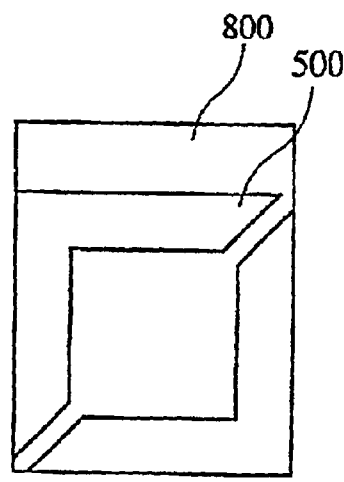
Figure 21C:
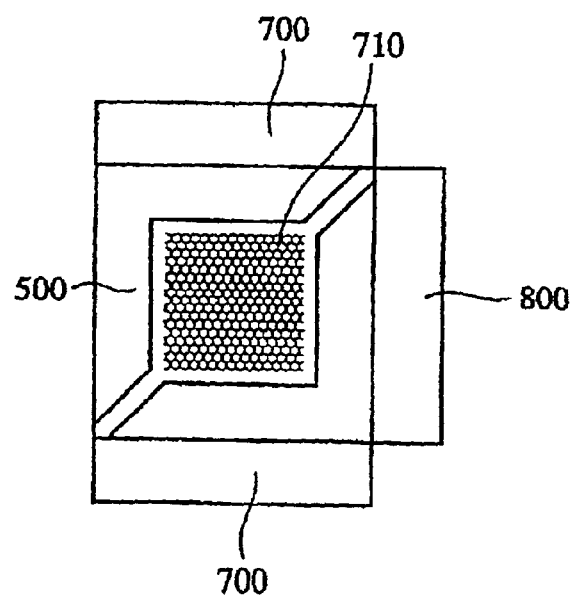
Figure 21D:
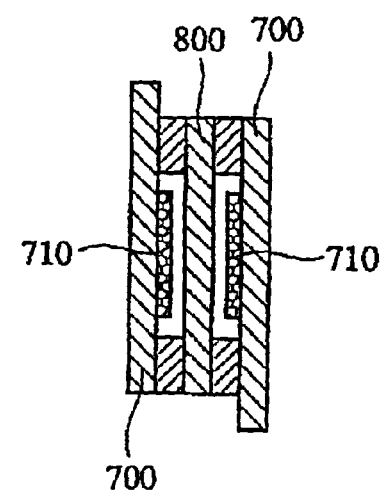

The counter electrode 800 was sandwiched between the two semiconductor electrodes 700 and heat welded to the semiconductor electrodes 700 while applying a pressure, to prepare a cell shown in FIGS. 21(c) and 21(d). Herein, the counter electrode 800 was sandwiched between the semiconductor electrodes 700 such that the photosensitive layers 710 were placed in central space of each spacer 500. An electrolyte composition E-301 shown in Table 3 was injected through the inlets of one spacer 500 to provide a differential response light-receiving device, an electrolyte composition E-302 shown in Table 3 was injected through the inlets of another spacer 500 to provide a stationary response light-receiving device, whereby a composite light-receiving device according to the present invention was produced. This composite light-receiving device comprised the differential response light-receiving device, the stationary response light-receiving device and the common counter electrode 800. Structures of Y8-3 used for the electrolyte composition E-302 is illustrated below.

TABLE 3

| | Electrolyte Composition | Contents of Electrolyte Composition (weight %) |
|---|---|---|
| Differential Response Light-Receiving Device | E-301 | Y7-2 (100) |
| Stationary Response Light-Receiving Device | E-302 | Y8-3 (50)/Y7-2 (48)/I$_2$ (2) |

(Y8-3)

$$CH_3-N^+{=}N-C_4H_9\text{-}n \quad I^-$$

3-2. Measurement of Photoelectric Current

Figure 22:
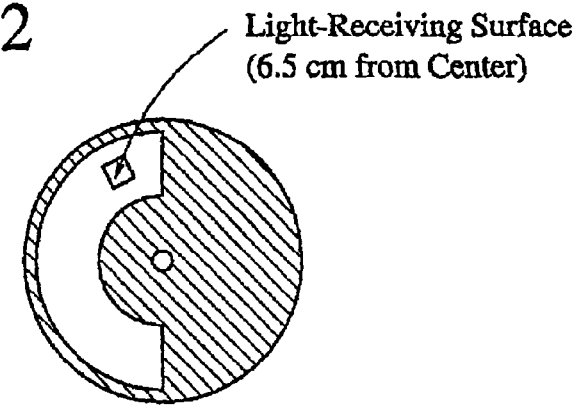
FIG. 22 is a schematic view showing the disc having a slit used in Example 3.

The differential response light-receiving device and the stationary response light-receiving device of the composite light-receiving device were independently connected to potentiostats, to measure each of a differential photoelectric current and a stationary photoelectric current provided by the composite light-receiving device. A disk having a slit shown in FIG. 22 was placed between the composite light-receiving device and the light source used in "1-4.", and a light was irradiated to the differential response light-receiving device side of the composite light-receiving device while rotating the disk at 3000 rpm, to measure each of the photoelectric currents provided to the potentiostats.

Figure 23A:
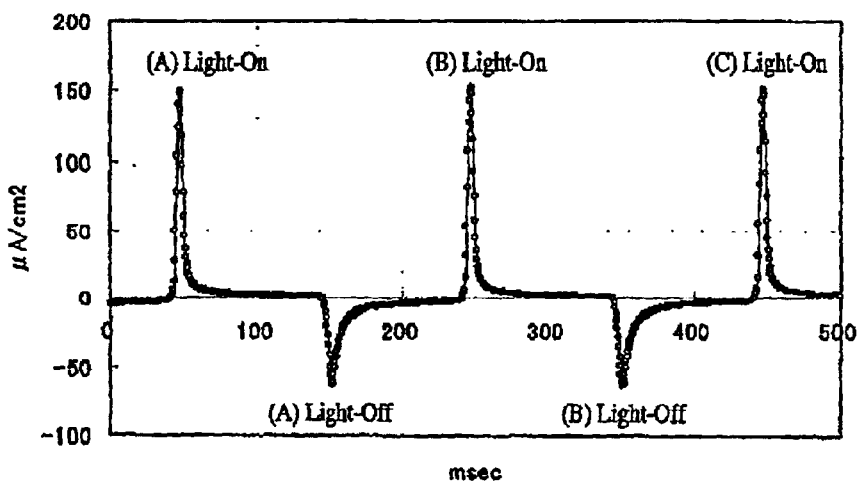
FIG. 23(a) is a graph showing the relation between quantity of light and photoelectric current provided by the differential response light-receiving device composing the composite light-receiving device produced in Example 3.
Figure 23B:
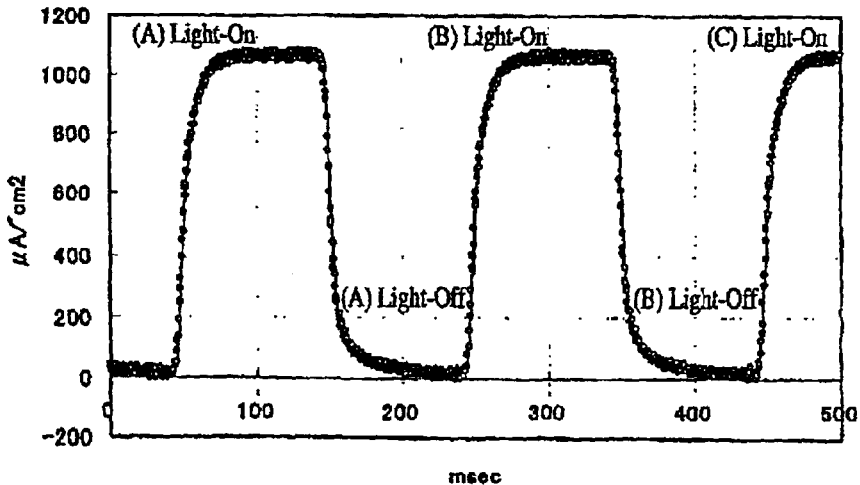
FIG. 23(b) is a graph showing the relation between quantity of light and photoelectric current provided by the stationary response light-receiving device composing the composite light-receiving device produced in Example 3.

FIG. 23(a) was a graph showing the relation between quantity of light and photoelectric current provided by the differential response light-receiving device, and FIG. 23(b) is a graph showing the relation between quantity of light and photoelectric current provided by the stationary response light-receiving device. As shown in FIG. 23(a), the differential response light-receiving device made a time-differential response to the quantity of light (light-on and light-off) to output the spike-like differential photoelectric current of + and −. As shown in FIG. 23(b), the stationary response light-receiving device made a stationary response to the quantity of light (light-on and light-off) to output the stationary photoelectric current. Thus, the composite light-receiving device comprising the differential response light-receiving device and the stationary response light-receiving device directly received a static photo-information and a dynamic photo-information at the same time.

As described in detail above, the differential response light-receiving device of the present invention makes a time-differential response to quantity of light to output a photoelectric current, thereby easily extracting dynamic information of a light or an image. A differential response light-receiving device comprising a plurality of semiconductor electrodes having a different photosensitive wavelength can detect color information in addition to the dynamic information of a light or an image. A composite light-receiving device of the present invention comprises a combination of the differential response light-receiving device and a stationary response light-receiving device that is used in a conventional dye-sensitized solar cell, thereby directly detecting a color information, a static information and a dynamic information of a light or an image at the same time.

What is claimed is:

1. A differential response light-receiving device comprising: a semiconductor electrode comprising an electrically conductive layer and a photosensitive layer containing a semiconductor sensitized by a dye; an ion-conductive electrolyte layer; and a counter electrode, said differential response light-receiving device making time-differential response to quantity of light to output a photoelectric current, said semiconductor sensitized by a dye primarily absorbing light to cause the generation of electrons and positive holes in said dye, and thereafter said semiconductor receiving and conveying said electrons or said holes, wherein said ion-conductive electrolyte layer is free of redox species, and wherein said semiconductor is a metal chalcogenide.

2. The differential response light-receiving device according to claim 1, wherein said semiconductor is a metal oxide selected from the group consisting of TiO$_2$, ZnO, SnO$_2$ and WO$_3$.

3. The differential response light-receiving device according to claim 1, wherein said differential response light-receiving device comprises a plurality of semiconductor electrodes, photosensitive wavelengths of said plurality of semiconductor electrodes being different from each other, and said ion-conductive electrolyte layer is disposed between said plurality of semiconductor electrodes and said counter electrode.

4. The differential response light-receiving device according to claim 3, wherein said plurality of semiconductor electrodes are arranged in such order that said photosensitive wavelengths are increasing from light incident side of said differential response light-receiving device.

5. The differential response light-receiving device according to claim 4, wherein said plurality of semiconductor electrodes comprises a blue-sensitive semiconductor electrode, a green-sensitive semiconductor electrode and a red-sensitive semiconductor electrode arranged in this order from said light incident side of said differential response light-receiving device.

6. A composite light-receiving device comprising the differential response light-receiving device recited in claim 1 and a stationary response light-receiving device, said differential response light-receiving device and said stationary response light-receiving device being arranged horizontally to said light-receiving surface or said differential response light-receiving device being stacked on said stationary response light-receiving device in the direction of light incidence.

7. The composite light-receiving device according to claim 6, wherein said differential response light-receiving device and said stationary response light-receiving device are stacked.

8. The composite light-receiving device according to claim 6, wherein said stationary response light-receiving device comprises: a semiconductor electrode comprising an electrically conductive layer and a photosensitive layer containing a semiconductor sensitized by a dye; a charge transfer layer comprising a hole-transporting material or an electrolyte composition containing redox species; and a counter electrode.

9. The composite light-receiving device according to claim 8, wherein said semiconductor within said stationary response light-receiving device is a metal oxide selected from the group consisting of $TiO_2$, $ZnO$, $SnO_2$ and $WO_3$.

10. The composite light-receiving device according to claim 8, wherein said stationary response light-receiving device comprises a plurality of semiconductor electrodes, photosensitive wavelengths of said plurality of semiconductor electrodes being different from each other, and said charge transfer layer is disposed between said plurality of semiconductor electrodes and said counter electrode.

11. The composite light-receiving device according to claim 10, wherein said plurality of semiconductor electrodes are arranged in such order that said photosensitive wavelengths are increasing from light incident side of said composite light-receiving device.

12. The composite light-receiving device according to claim 11, wherein said plurality of electrodes comprises a blue-sensitive semiconductor electrode, a green-sensitive semiconductor electrode and a red-sensitive semiconductor electrode arranged in this order from said light incident side of said composite light-receiving device.

13. An image sensor comprising a plurality of pixels, wherein each of said pixels comprises the differential response light-receiving device recited in claim 1.

14. An image sensor comprising a plurality of pixels, wherein each of said pixels comprises the composite light-receiving device recited in claim 6.

* * * * *